(12) United States Patent
Kim

(10) Patent No.: US 10,175,526 B2
(45) Date of Patent: Jan. 8, 2019

(54) METHOD OF MANUFACTURING LINEAR GRID FOR SUBSTRATE, AND MOLD AND DISPLAY APPARATUS MANUFACTURED BY THE SAME

(71) Applicant: SAMSUNG ELECTRONICS CO., LTD., Suwon-si, Gyeonggi-do (KR)

(72) Inventor: Dong-hwan Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 150 days.

(21) Appl. No.: 14/995,326

(22) Filed: Jan. 14, 2016

(65) Prior Publication Data
US 2016/0231621 A1  Aug. 11, 2016

(30) Foreign Application Priority Data
Feb. 11, 2015 (KR) .................. 10-2015-0020852

(51) Int. Cl.
| | |
|---|---|
| H01L 21/469 | (2006.01) |
| G02F 1/1335 | (2006.01) |
| G03F 7/00 | (2006.01) |
| G02B 5/30 | (2006.01) |

(52) U.S. Cl.
CPC ...... *G02F 1/133528* (2013.01); *G02B 5/3025* (2013.01); *G02F 1/133536* (2013.01); *G03F 7/0002* (2013.01); *G02F 2001/133548* (2013.01)

(58) Field of Classification Search
CPC . G03F 7/70475; G03F 7/70466; H01L 21/47; H01L 21/31058
USPC .................................................. 430/329, 326
See application file for complete search history.

(56) References Cited

U.S. PATENT DOCUMENTS 8,097,311 B2   1/2012   Wang et al.

FOREIGN PATENT DOCUMENTS

KR   2003-0029939   4/2003

*Primary Examiner* — Daborah Chacko-Davis
(74) *Attorney, Agent, or Firm* — Nixon & Vanderhye P.C.

(57) ABSTRACT

A method of manufacturing a linear grid on a substrate to form a linear grid pattern of a display panel, the method including: laminating a negative photoresist layer having a linear grid pattern on a first area of a substrate, said substrate including a pattern forming layer disposed thereon; laminating a positive photoresist layer having a linear grid pattern on a second area of the substrate and overlapping at least a portion of the negative photoresist layer of the first area; covering the second area with a mask and exposing the first area; and forming a linear grid pattern by removing the mask and etching the pattern forming layer.

8 Claims, 31 Drawing Sheets

METHOD OF MANUFACTURING LINEAR GRID FOR SUBSTRATE, AND MOLD AND DISPLAY APPARATUS MANUFACTURED BY THE SAME

CROSS-REFERENCE TO RELATED APPLICATION

This application is based on and claims priority under 35 U.S.C. § 119 to Korean Patent Application No. 10-2015-0020852, filed on Feb. 11, 2015 in the Korean Intellectual Property Office, the disclosure of which is incorporated by reference herein in its entirety.

BACKGROUND

Field

Apparatuses and methods relate generally to a method of manufacturing a linear grid for a substrate to form a linear-grid structure on a substrate of various display panels, and a mold and display apparatus manufactured by the same, and for example, to a method of manufacturing a linear grid for a substrate, in which a manufacturing fault such as a seam line is minimized or reduced when a master mold corresponding to the linear grid formed on the substrate for a large screen is manufactured, and a mold and display apparatus manufactured by the same.

Related Art

A display apparatus includes a display panel for displaying an image based on a broadcast signal or an image signal/image data of various formats, and is achieved by a television, a monitor, etc. Such a display panel is achieved by various types such as a liquid crystal display panel, a plasma display panel, etc. and applied to various display apparatuses in accordance with its types.

The display panel provided in the display apparatus may be classified into a light-receiving panel structure and a self-emissive panel structure in accordance with its lighting types. In the light-receiving panel structure, the panel needs a separate backlight unit for illuminating the panel since it cannot emit light by itself. For example, the liquid crystal display panel corresponds to the light-receiving panel structure. In the self-emissive panel structure, the panel needs no backlight unit since it can emit light by itself. For example, an organic light emitting diode (OLED) panel corresponds to the self-emissive panel structure.

Any structure of the display panel needs a polarization layer for filtering a certain orientation component of incident light. In general, a polarization film laminated on a glass substrate serves as the polarization layer. As an alternative to the polarization film, there has been proposed a nano-scale linear grid (or a wire-grid) structure formed on the glass substrate of the panel. In this proposal, a linear grid pattern corresponding to the size of the glass substrate is first formed on a master mold, and then the linear grid pattern is transferred from the master mold to the glass substrate.

However, if a linear grid for a large screen is manufactured, it is difficult to form a linear grid pattern on the master mold at one time. Therefore, the linear grid pattern has to be formed on the master mold in stages corresponding to areas, and thus there is discontinuity in the linear grids formed on the master mold between the corresponding areas. This discontinuity is called a seam line, and it is important how much the seam line is minimized when the master mold is manufactured, in order to prevent defects in the display panel of an end product.

SUMMARY

A method of manufacturing a linear grid of a substrate to form a linear grid pattern of a display panel, the method including: laminating a negative photoresist layer having a linear grid pattern on a first area of a substrate, said substrate having a pattern forming layer disposed thereon; laminating a positive photoresist layer having a linear grid pattern on a second area of the substrate, said positive photoresist layer overlapping at least a portion of the negative photoresist layer of the first area; covering the second area with a mask and exposing the first area; and forming a linear grid pattern by removing the mask and etching the pattern forming layer. Thus, it is possible to minimize and/or reduce the discontinuity in the linear grid pattern formed between the first area and the second area.

The exposure may be performed using ultraviolet rays, and the negative photoresist layer may harden when exposed to the ultraviolet rays, and the positive photoresist layer may decompose when exposed to the ultraviolet rays. A portion of the positive photoresist layer, overlapping at least a portion of the negative photoresist layer, may be removed by the ultraviolet rays. Thus, the exposure can minimize and/or reduce a difference in height when the linear grid pattern formed in the positive photoresist layer approaches the linear grid pattern formed in the negative photoresist layer.

The pattern forming layer may be laminated on the substrate, and the negative photoresist layer and the positive photoresist layer may be laminated on the pattern forming layer. The pattern forming layer may include silicon or silica. Thus, it is easy to form the linear grid pattern on the substrate through etching.

The etching may be performed by injecting etching gas on to the linear grid patterns respectively formed on the negative photoresist layer and the positive photoresist layer. Each of the negative photoresist layer and the positive photoresist layer may include a protruding portion for hindering the etching gas from etching the pattern forming layer, and a recessed portion thinner than the protruding portion that facilitates etching of the pattern forming layer. Thus, the linear grid patterns respectively formed in the negative photoresist layer and the positive photoresist layer can be directly transferred to the pattern forming layer through etching using, for example, gas.

The negative photoresist layer of the first area and the positive photoresist layer of the second area may have substantially the same height. Thus, it is possible to minimize and/or reduce a difference in height between the linear grid pattern formed in the first area and the linear grid pattern formed in the second area.

The first area and the second area may be adjacent to each other on the substrate. Thus, it is possible to form the linear grid pattern on the first area and the second area using a single etching process.

At least a portion of the positive photoresist layer may overlap at least a portion of the negative photoresist layer of the first area. Thus, a part of the positive photoresist layer, which is not protected by the mask, can be removed through the exposure.

A mold may be manufactured by the above method, and may be provided for forming the linear grid pattern on the display panel.

A display apparatus including a display panel having a substrate manufactured by the above method may also be provided.

BRIEF DESCRIPTION OF THE DRAWINGS

The above and/or other aspects will become apparent and more readily appreciated from the following detailed description, taken in conjunction with the accompanying drawings, in which like reference numerals refer to like elements, and wherein.

DETAILED DESCRIPTION

Below, example embodiments will be described in greater detail with reference to accompanying drawings. The following descriptions of the example embodiments are made by referring to elements shown in the accompanying drawings, in which like numerals refer to like elements having substantively the same functions.

In the description of the example embodiments, an ordinal number used in terms such as a first element, a second element, etc. is employed for describing variety of elements, and the terms are used for distinguishing between one element and another element. Therefore, the meanings of the elements are not limited by the terms, and the terms are also used simply for explaining the corresponding example without limiting the disclosure.

Further, the example embodiments will describe only elements directly related to the disclosure, and a description of other elements may be omitted. However, it will be appreciated that the elements, the descriptions of which are omitted, may not be unnecessary to realize the apparatus or system according to the example embodiments. In the following descriptions, terms such as "include" or "have" refer to presence of features, numbers, steps, operations, elements or combination thereof, and do not exclude presence or addition of one or more other features, numbers, steps, operations, elements or combination thereof.

Figure 1:
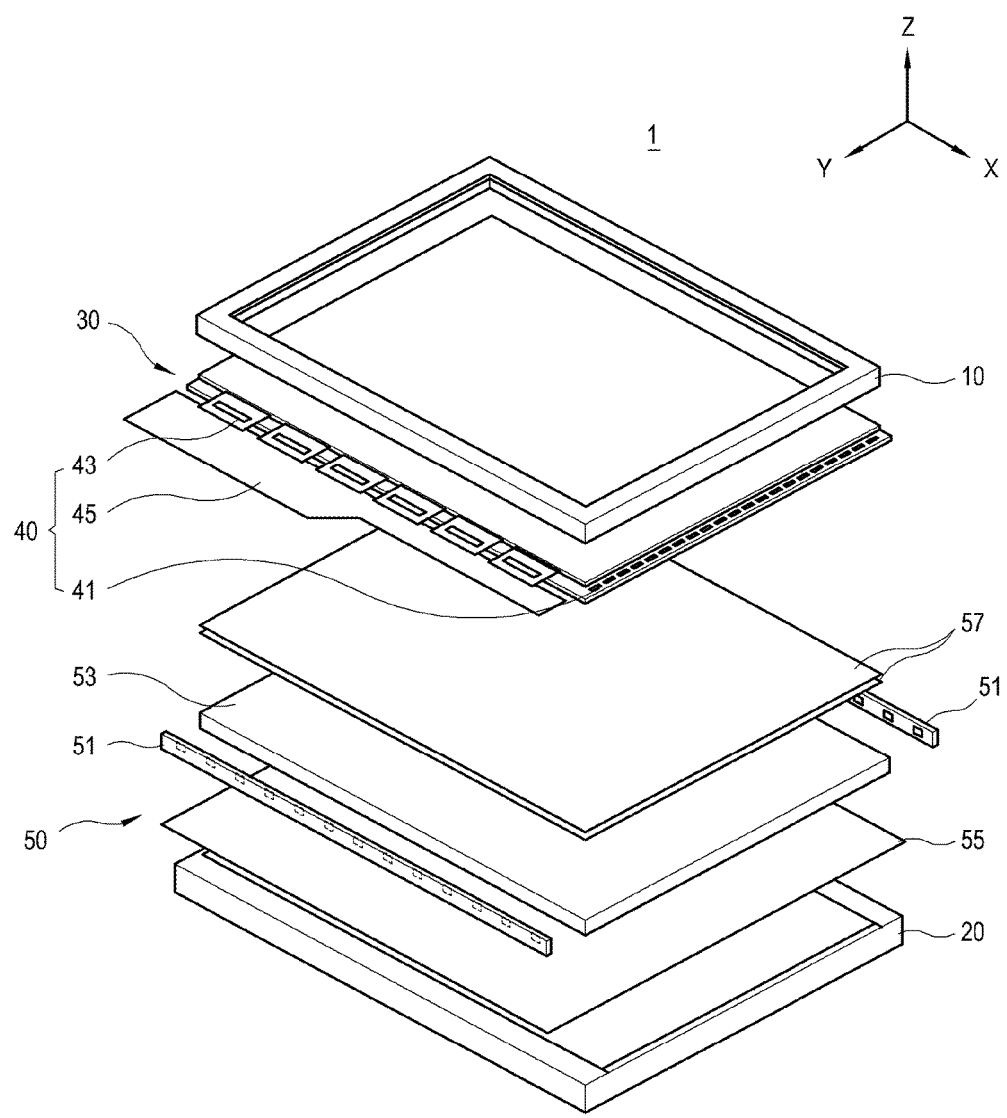
FIG. 1 is an exploded perspective view illustrating an example display apparatus.

FIG. 1 is an exploded perspective view illustrating an example display apparatus 1. This example embodiment describes the display apparatus 1 including a liquid crystal display panel 30, but is not limited thereto. The disclosure may be equally applied to a self-emissive display panel such as an organic light emitting diode (OLED), or the like.

As illustrated in FIG. 1, the display apparatus 1 is an apparatus that may process an image signal received from an exterior and display the processed image. This example embodiment refers to a television (TV) as an example of the display apparatus 1. However, the display apparatus 1 may be variously achieved by a monitor, a portable multimedia player, a mobile phone, etc., and there is no limit to the display apparatus as long as it includes a display panel for displaying an image.

The display apparatus 1 may, for example, include cover frames 10 and 20 forming an accommodating space therein, a display panel 30 accommodated in the accommodating space between the cover frames 10 and 20 and displaying an image on an upper surface thereof, a panel driver 40 for driving the display panel 30, and a backlight unit 50 facing a lower surface of the display panel 30 in the accommodating space between the cover frames 10 and 20 and emitting light in the direction of the display panel 30.

The directions illustrated in FIG. 1 are as follows. X, Y, Z refers to length, width and normal directions of the display panel 30 in FIG. 1, respectively. In FIG. 1, the display panel 30 is arranged parallel with an X-Y plane formed between an axis of the X direction and an axis of the Y direction, and the cover frames 10 and 20, the display panel 30 and the backlight unit 50 are arranged to be stacked along an axis of the Z direction. In addition, the opposite directions of the X, Y and Z directions are represented with −X, −Y, −Z, respectively.

Unless otherwise noted, "above/upper" refers to the Z direction and "below/lower" refers to the −Z direction. For example, the backlight unit 50 is placed below the display panel 30, and the light emitted from the backlight unit 50 enters the lower surface of the display panel 30 and exits from the upper surface of the display panel 30.

The cover frames 10 and 20 form an outer appearance of the display apparatus 1, and support the display panel 30 and the backlight unit 50 which are accommodated therein. In the drawings, if the Z direction refers to an upward or frontward direction of the display panel 30 and the −Z direction refers to a downward or backward direction of the display panel 30, the cover frames 10 and 20 include a front cover 10 supporting the front of the display panel 30, and a rear cover 20 supporting the rear of the backlight unit 50. The front cover 10 includes an opening on a plane parallel with the X-Y plane, through which an image displaying area of the display panel 30 is exposed to the outside.

The display panel 30 may, for example, be a liquid crystal display panel, in which a liquid crystal layer (not shown) is sandwiched between two substrates (not shown) and the liquid crystal layer may be changed in orientation corresponding to a driving signal, thereby displaying an image. The display panel 30 cannot emit light by itself, and thus needs light of the backlight unit 50 to display an image on the image displaying area.

The panel driver 40 applies the driving signal to the display panel 30 for driving the liquid crystal layer (not shown). The panel driver 40 may, for example, include a gate driving integrated circuit (IC) 41, a data chip film package 43, and a printed circuit board 45.

The gate driving IC 41 may be directly mounted to a substrate (not shown) of the display panel 30 and connected to gate lines (not shown) of the display panel 30. The data chip film package 43 may be connected to data lines (not shown) of the display panel 30. The data chip film package 43 may include a tape automated bonding (TAB) tape bonded to a wiring pattern, where a semiconductor chip is formed on a base film, by a TAB technology. As an example of the chip film package, a tape carrier package (TCP), a chip on film (COF), etc. may be used. The printed circuit board 45 may input a gate driving signal to the gate driving IC 41, and may input a data driving signal to the data chip film package 43.

The panel driver 40 with this example configuration inputs the driving signals to the respective gate and data lines (not shown) of the display panel 30 and thus drives the liquid crystal layer (not shown) of the display panel 30 in units of pixels.

The backlight unit 50 is arranged in the −Z direction of the display panel 30 so as to emit light to the lower surface of the display panel 30. The backlight unit 50 may, for example, include a light source 51 arranged, for example, at an edge of the display panel 30, a light guide plate 53 arranged parallel with the display panel 30 and facing the lower surface of the display panel 30, a reflective plate 55 arranged below the light guide plate 53 and facing the lower surface of the light guide plate 53, and one or more optical sheets 57 interposed between the display panel 30 and the light guide plate 53.

This example embodiment describes the backlight unit 50 of an edge type structure where the light source 51 is placed at the edge of the light guide plate 53, and a light emitting direction of the light source 51 is perpendicular to a light exiting direction of the light guide plate 53. However, the backlight unit 50 is not limited to this example embodiment, and may be designed variously. For example, the backlight unit 50 may have a direct type structure where the light source 51 is placed below the light guide plate 53 and the light emitting direction of the light source 51 is parallel with the light exiting direction of the light guide plate 53.

The light source 51 generates light and emits the generated light to the light guide plate 53. The light source 51 is arranged to stand on the plane of the display panel 30, i.e., the X-Y plane, and provided along one or more among four edges of the display panel 30 or the light guide plate 53. The light source 51 may be achieved by sequentially arranging light emitting devices (not shown) such as light emitting diodes (LEDs) on a module substrate (not shown) extended along the X direction.

The light guide plate 53 may, for example, include a plastic lens made of an acrylic mold or the like, and substantially uniformly guides the incident light of the light source 51 throughout the image displaying area of the display panel 30. The surface of the light guide plate 53 in the −Z direction, i.e. the lower surface of the light guide plate 53, faces the reflective plate 55, and lateral walls in the Y and −Y directions among four lateral walls of the light guide plate 53 between the upper surface and the lower surface face the light source 51. Thus, the light emitted from the light source 51 enters the lateral walls in the Y and −Y directions of the light guide plate 53.

Since various optical patterns (not shown) for diffusely reflecting the light traveling within the light guide plate 53 or changing the traveling direction of the light are formed on the lower surface of the light guide plate 53, it is possible to substantially uniformly guide the light emitted from the light guide plate 53.

The reflective plate 55 returns the light exiting from the lower surface of the light guide plate 53 to the light guide plate 53. The reflective plate 55 returns the light, which is not reflected from the optical pattern formed on the lower surface of the light guide plate 53, toward the inside of the light guide plate 53. To this end, an upper surface of the reflective plate 55 may preferably have properties of total reflection.

One or more optical sheets 57 are stacked on the light guide plate 53 and may control the properties of the light exiting from the light guide plate 53. The optical sheet 57 may include a diffusion sheet, a prism sheet, a protection sheet, etc., and two or more optical sheets may be combined to achieve desired optical properties.

Figure 2:
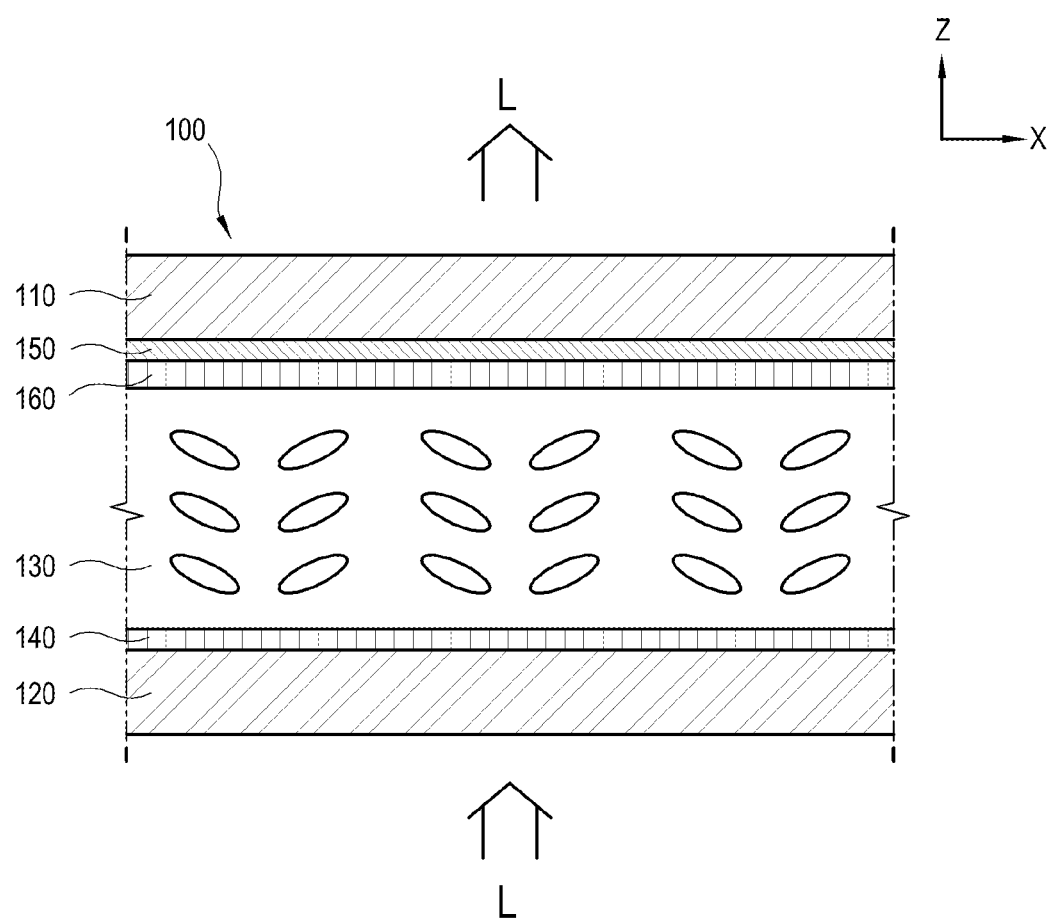
FIG. 2 is a cross-sectional view illustrating example elements laminated to form a display panel in the example display apparatus of FIG. 1.

FIG. 2 is a cross-sectional view illustrating example elements laminated to form a display panel 100. The display panel 100 of FIG. 2 is substantially the same as the display panel 30 of FIG. 1, and thus applicable to the display apparatus 1 of FIG. 1.

As illustrated in FIG. 2, light L emitted in the Z direction from the backlight unit 50 (refer to FIG. 1) enters the display panel 100, and exits in the Z direction after passing through many elements of the display panel 100. In the following description, the representations of "above/upper" and the "below/lower" are used to illustrate a relative arrangement or laminated relationship along the traveling direction of the light, i.e. the Z direction.

The display panel 100 includes an upper substrate 110, a lower substrate 120 arranged to face the upper substrate 110, a liquid crystal layer 130 sandwiched between the upper substrate 110 and the lower substrate 120, a lower polarization layer 140 interposed between the liquid crystal layer 130 and the lower substrate 120, an upper polarization layer 150 interposed between the liquid crystal layer 130 and the upper substrate 110, and a color-filter layer 160 interposed between the liquid crystal layer 130 and the upper polarization layer 150.

The display panel 100 is one of various panel types, and may have various panel structures in accordance with designs. This example embodiment does not limit the structure of the display panel 100. Further, this example embodiment schematically illustrates only representative elements among the elements of the display panel 100. The actual structure of the display panel 100 may be more complicated than that set forth herein and may include additional elements to the described elements. Thus, only the basic structure of the display panel 100 directly related to the disclosure will be described, and unrelated details may be omitted.

Below, the elements of the display panel 100 will be described in greater detail.

The upper substrate 110 and the lower substrate 120 are transparent and face each other with a predetermined space therebetween along the traveling direction of the light. In light of material, the upper substrate 110 and the lower substrate 120 may be made of glass or plastics. For instance, the plastics for the upper substrate 110 and the lower substrate 120 may include poly-carbonate (PC), poly-imide (PI), poly-ethersulphone (PES), poly-acrylate (PAR), poly-ethylene-naphthelate (PEN), poly-ethylene-terephehalate (PET), etc.

The upper substrate 110 and the lower substrate 120 may be required to have preset properties in accordance with driving types of the liquid crystal layer 130. For example, the upper substrate 110 and the lower substrate 120 may be made of soda lime glass if the liquid crystal layer 130 is driven by a passive matrix type, and alkali free glass and borosilicate glass if the liquid crystal layer 130 is driven by an active matrix type.

The liquid crystal layer 130 is positioned between the upper substrate 110 and the lower substrate 120, and changed in orientation of liquid crystal in accordance with applied driving signals, thereby controlling light transmission. Usual liquid has no regularity in orientation and arrangement of molecules, but the liquid crystal is similar to liquid phase having certain regularity. For instance, there is a solid that becomes liquid phase exhibiting double refraction or the like anisotropy when it is heated and melted. The liquid crystal has optical properties such as double refraction or color change. Such a substance with two properties such as regularity of a crystal and a phase of liquid is called the liquid crystal. When voltage is applied to the liquid crystal, molecules are changed in arrangement and thus optical properties are changed.

The liquid crystal of the liquid crystal layer 130 may, for example, be classified into nematic, cholesteric, smectic, ferroelectric liquid crystals, etc. in accordance with arrangement of molecules.

The lower polarization layer 140 may be formed on the surface of the lower substrate 120 in the Z direction, i.e. the surface of the lower substrate 120 from which the light L exits. The lower polarization layer 140 transmits only a preset first polarized component of the light L, and reflects the other components.

The upper polarization layer 150 may be formed on the upper substrate 110 in the −Z direction, i.e. the surface of the upper substrate 110 which the light L enters. The upper polarization layer 150 transmits only a preset second polarized component of the light L passed through the lower substrate 120, the lower polarization layer 140 and the liquid crystal layer 130, and reflects the other components.

The second polarization direction is different from the first polarization direction, and for example perpendicular to the first polarization direction. This arrangement is selected because the polarized direction of the light L is rotated by 90 degrees as the light L passes through the liquid crystal layer 130. If the upper polarization layer 150 transmits a component of light in the same first polarization direction as the lower polarization layer 140, the light passed through the lower polarization layer 140 and having the first polarization direction cannot pass through the upper polarization layer 150 since it is changed to have the second polarization direction while passing through the liquid crystal layer 130. Therefore, the polarized direction of the light passed through the upper polarization layer 150 is perpendicular to the polarized direction of the light passed through the lower polarization layer 140.

The upper polarization layer 150 and the lower polarization layer 140 may be respectively formed on the surfaces of the upper substrate 110 and the lower substrate 120, and provided in the form of, for example, a linear grid (not shown) shaped like a plurality of bars (not shown) extended in certain directions parallel with the X-Y plane. The bars (not shown) forming the linear grid (not shown) are arranged to have preset regular pitches, and extended in directions corresponding to the polarization directions. Further, the linear grid (not shown) of the upper polarization layer 150 protrudes from the upper substrate 110 toward the liquid crystal layer 130, and the linear grid (not shown) of the lower polarization layer 140 protrudes from the lower substrate 120 toward the liquid crystal layer 130.

Below, the structure of the lower polarization layer 140 will be described with reference to FIG. 3. This description may also be applied to the structure of the upper polarization layer 150.

Figure 3:
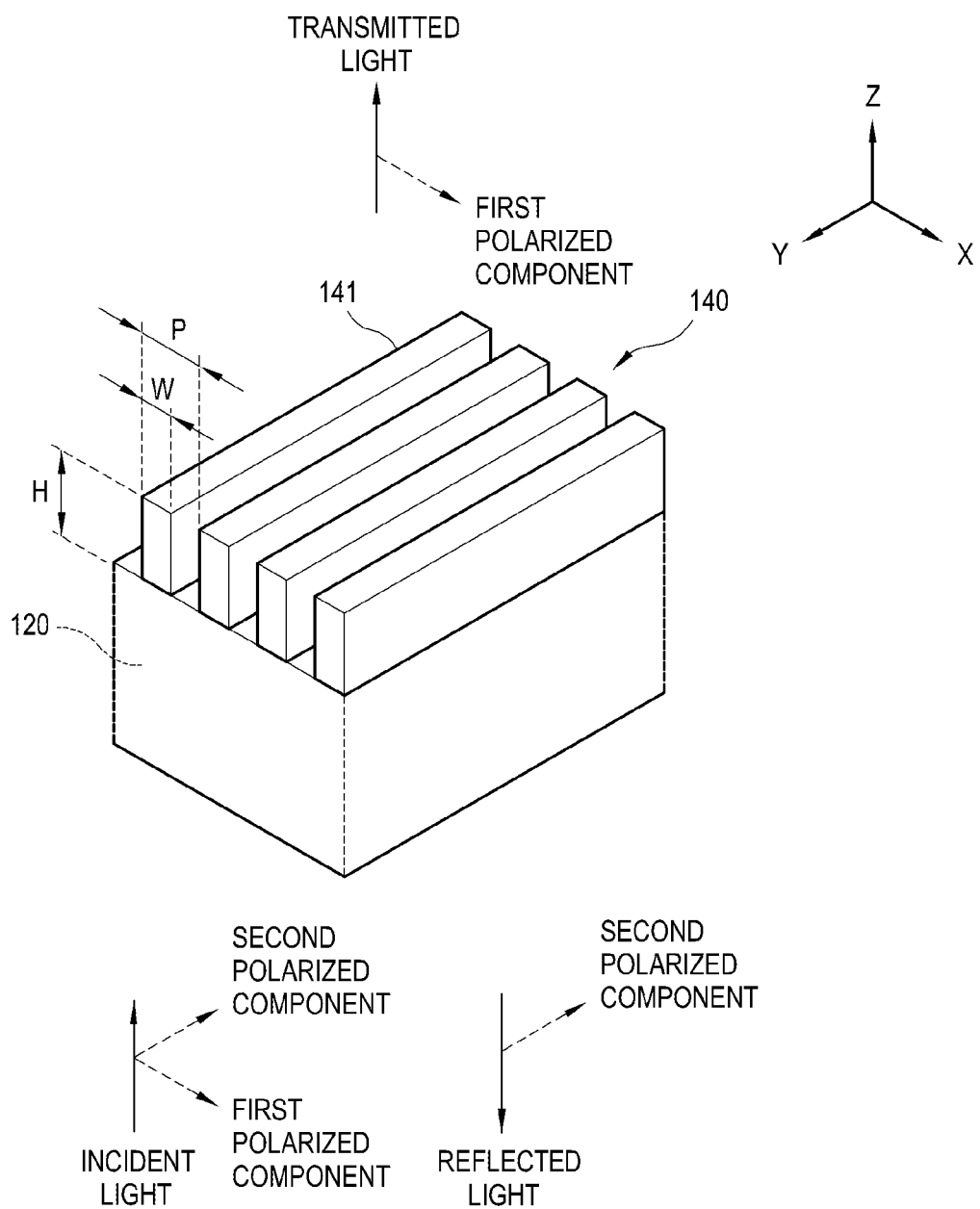
FIG. 3 is a partial perspective view illustrating an example lower polarization layer in the example display panel of FIG. 2.

FIG. 3 is a partial perspective view illustrating an example of the lower polarization layer 140.

As illustrated in FIG. 3, the lower polarization layer 140 may, for example, have a linear grid (or wire grid) structure in which a plurality of bars 141 protruding in the Z direction and extending in parallel along the Y direction are arranged on the lower substrate 120. Each bar 141 may have a preset height H and a preset width W, and the plurality of bars 141 are regularly arranged to have preset pitches P therebetween.

With this linear grid structure, if the pitch P is adjusted to be a half wavelength of light, there are only the transmitted light and the reflected light without diffracted waves. In the linear grid, a slit is formed in between two bars 141 adjacent to each other, and a first polarization component of incident light, which has the first polarization direction perpendicular to the extending direction of the bars 141, passes through the lower polarization layer 140. On the other hand, a second polarization component having the second polarization direction parallel with the extending direction of the bars 141 is reflected in the −Z direction without passing through the lower polarization layer 140. With this linear grid structure, the light passing through the lower polarization layer 140 is filtered and polarized in the first polarization direction.

The light reflected from the lower polarization layer 140 without passing the lower polarization layer 140 is reflected again together with the light emitted from the light source 51 (see FIG. 1) by the reflective plate 55 (see FIG. 1) toward the display panel 100. Since the filtered light that cannot pass through the lower polarization layer 140 is reused, it is possible to improve overall optical efficiency of the display panel 100 without requiring a conventional dual brightness enhancement film (DBEF).

To improve the polarization filtering characteristics of the lower polarization layer 140, a ratio of width (W) to height (H) of the bar 141, i.e. an aspect ratio may, for example, be equal to or higher than 1:3.

Likewise, the upper polarization layer 150 has a linear grid structure similar to that of the foregoing lower polarization layer 140 except that the linear grid (not shown) of the upper polarization layer 150 has an extending direction perpendicular to the extending direction of the linear grid 141 of the lower polarization layer 140. For example, if the linear grid 141 of the lower polarization layer 140 is extended in the Y direction, the linear grid (not shown) of the upper polarization layer 150 is extended in the X direction perpendicular to the Y direction. Thus, the upper polarization layer 150 transmits the second polarization component, but not the first polarization component.

Figure 4:
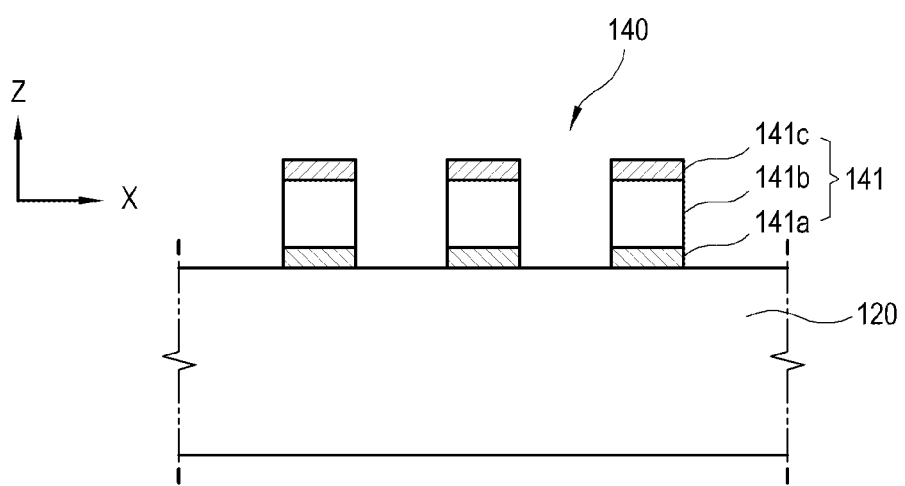
FIG. 4 to FIG. 6 are lateral cross-sectional views illustrating example laminated structures of the lower polarization layer of FIG. 3.
Figure 5:
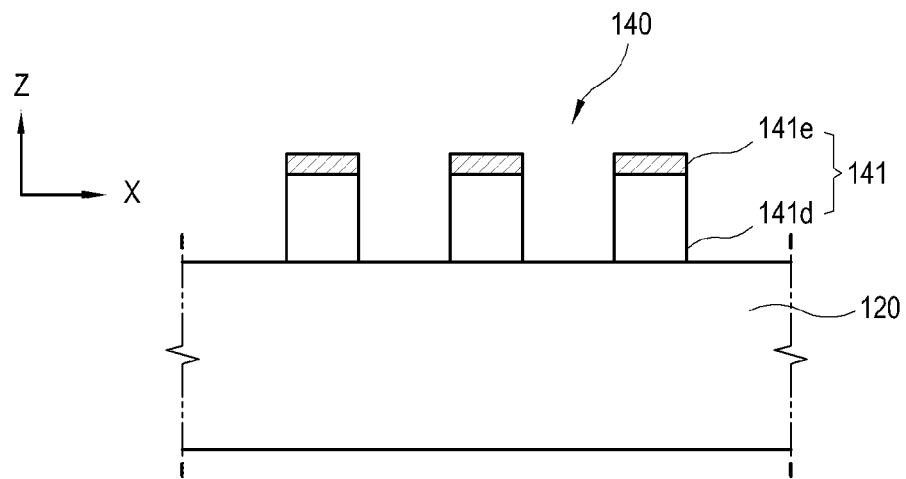
Figure 6:
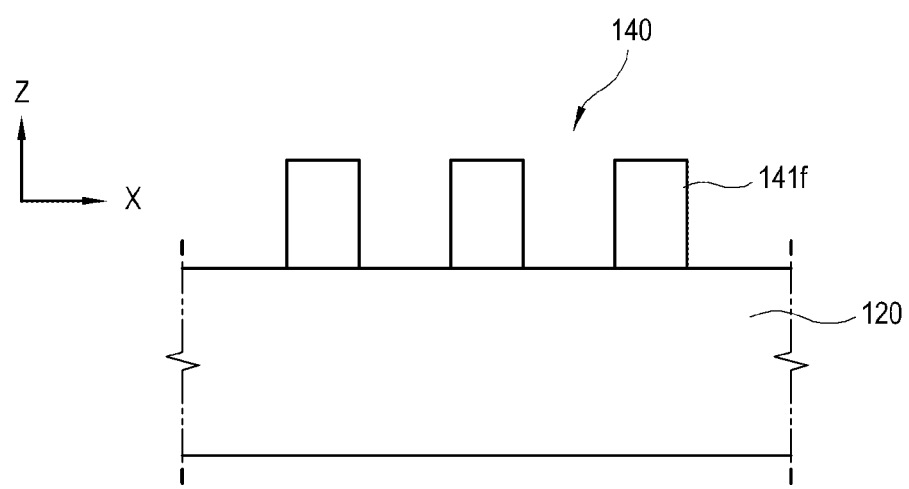

FIG. 4 to FIG. 6 are lateral cross-sectional views illustrating example laminated structures of the lower polarization layer 140.

As illustrated in FIG. 4, each bar 141 of the lower polarization layer 140 may include, for example, a three-layered structure where a first dielectric layer 141a, a metal layer 141b and a second dielectric layer 141c are sequentially laminated on the lower substrate 120. In light of materials, the first dielectric layer 141a may include silicon nitride (SiNx), the metal layer 141b may include a metal or polysilicon, and the second dielectric layer 141c may include silicon oxide (SiO2). Of course, there are no limits to such a material, and the respective layers may include different materials.

The metal layer 141b may include a metallic material Au, Al, Cu, Ag, or the like that reflects light, and reflects the untransmitted polarization-component of the light toward the back of the display panel 100, i.e. toward the backlight unit (not shown). The second dielectric layer 141c protects the metal layer 141b or may, for example, function as a light absorbing layer for absorbing external light.

Further, as illustrated in FIG. 5, each bar 141 of the lower polarization layer 140 may, for example, have a two-layered structure where a metal layer 141d and a dielectric layer 141e are sequentially laminated on the lower substrate 120. In this case, the metal layer 141d functions to reflect the untransmitted polarization-component of the light.

In addition, as illustrated in FIG. 6, each bar of the lower polarization layer 140 may, for example, have a one-layered structure where the metal layer 141d is laminated on the lower substrate 120.

Although not shown, the lower polarization layer 140 may, for example, be formed on the lower substrate 120 by directly carving or etching the surface of the lower substrate 120 instead of laminating such a separate layer of a metallic or dielectric substance on the lower substrate 120.

The upper polarization layer 150 (see FIG. 2) is shaped as if the lower polarization layer 140 is turned upside down. That is, the lower polarization layer 140 includes the bars protruding upward from the lower substrate 120 in the Z direction, whereas the upper polarization layer 150 includes the bars protruding downward from the upper substrate 110 (see FIG. 2) in the −Z direction. The bars of the upper polarization layer 150 may have a structure similar to but be different in detailed functions from that of the lower polarization layer 140. For example, the dielectric layer contacting the upper substrate 110 may function as the light absorbing layer in the upper polarization layer 150 on the contrary to the lower polarization layer 140.

To form the foregoing polarization layer having the linear grid structure as illustrated in FIG. 4 to FIG. 6 on the upper substrate 110 or the lower substrate 120 of the display panel 100, a manufacturer first manufactures a master mold with a linear grid pattern having a size corresponding to the display panel 100, and then transfers the linear grid pattern from the master mold to the substrate of the display panel 100. If the master mold corresponding to the display panel 100 is manufactured to meet a certain standard, a manufacturer can apply the linear grid pattern transferred from this master mold to the plurality of display panels 100 having a certain standard. Since one master mold is used for mass production of the linear grid pattern, it is excellent in terms of productivity.

The master mold is manufactured by forming the plurality of bars extended in one direction corresponding to the linear grid pattern, on a crystal substrate having a size corresponding to the upper substrate 110 or the lower substrate 120 of the display panel 100 to which the linear grid pattern is finally transferred. A manufacturer uses the master mold to make a pattern template for the linear grid and transfers the pattern template to the transparent substrate of the display panel 100, thereby forming the polarization layer having the linear grid pattern on the transparent substrate. The pattern template is a frame including the linear grid pattern, and there are no limits to a material for the pattern template.

FIG. 7 to FIG. 10 sequentially illustrate an example method of forming the pattern template for the linear grid.

Figure 7:
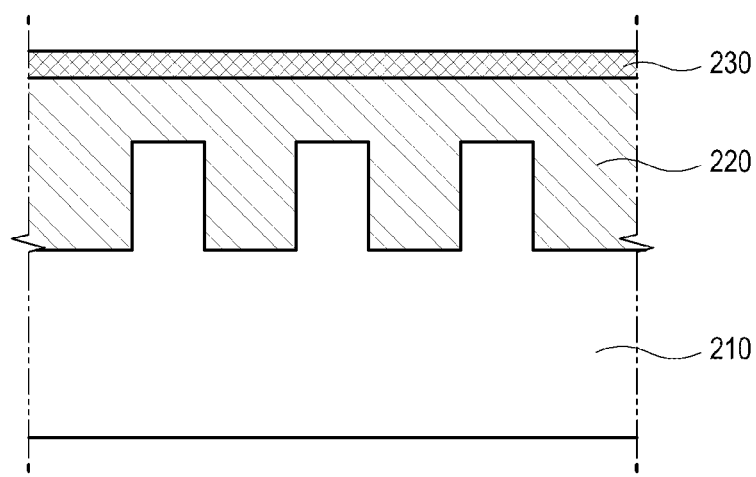
FIG. 7 to FIG. 10 sequentially illustrate an example method of forming a pattern template for an example linear grid.

As illustrated in FIG. 7, a manufacturer manufactures a master mold 210 with crystal or silicon. A method of manufacturing the master mold 210 will be described in greater detail below. The linear grid pattern is formed on the upper surface of the master mold 210.

The manufacturer applies poly-vinyl alcohol (PVA) 220 to the upper surface of the master mold 210, and a carrier 230 is bonded onto the PVA 220.

The PVA 220 may be removed by water or other solvents since it can be dissolved by water or other solvents. Further, the carrier 230 is used just for separating the PVA 220 from the master mold 210, and there are no limits to the kind of carrier as long as it can easily separate the PVA 220 from the master mold 210.

Figure 8:
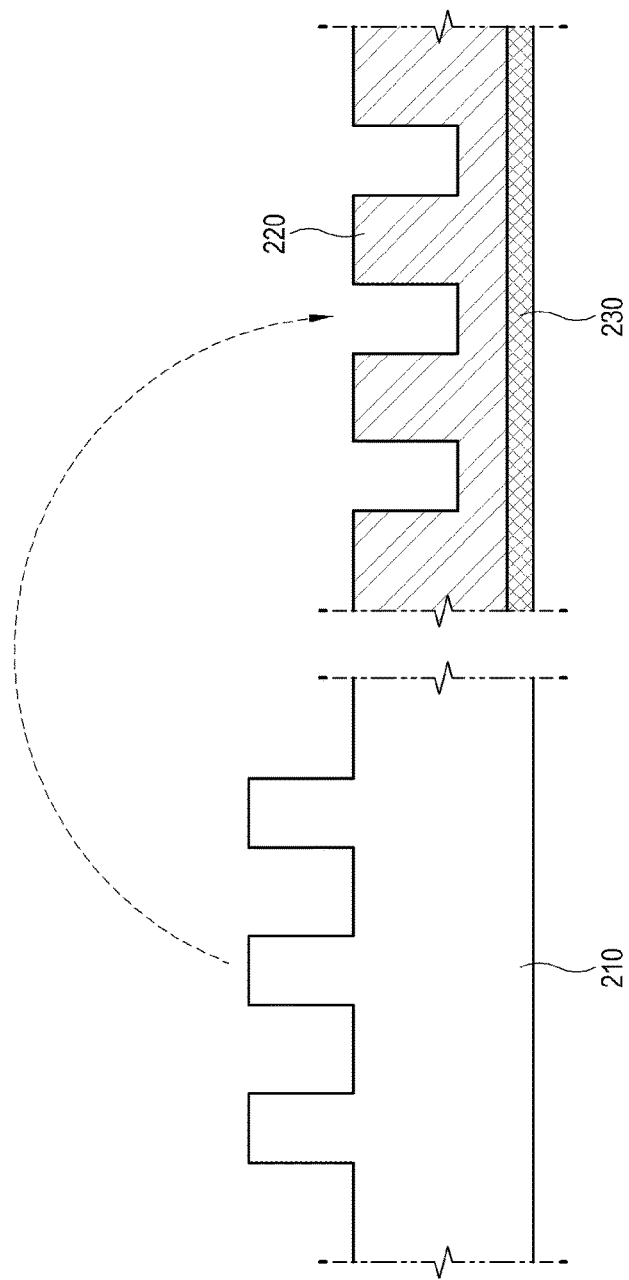

As illustrated in FIG. 8, a manufacturer separates the PVA 220 together with the carrier 230 from the master mold 210. At this time, the manufacturer separates the PVA 220 and the carrier 230 from the master mold 210 and turns them upside down so that the carrier 230 can face downward and the PVA 220 can face upward. Thus, the surface of the PVA 220 formed with a pattern corresponding to the linear grid faces upward.

Figure 9:
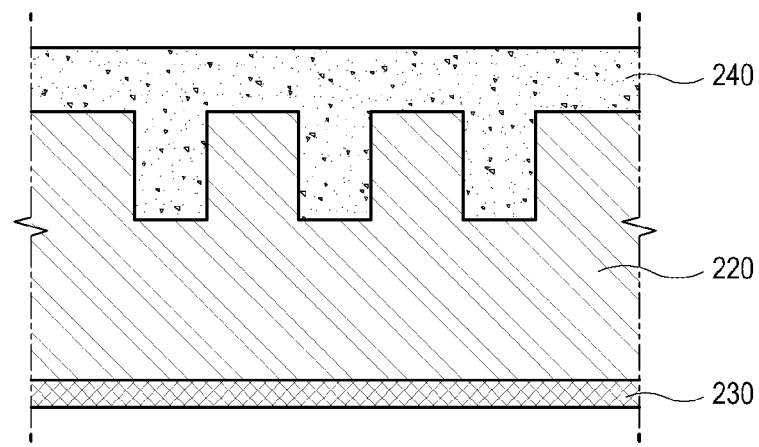

As illustrated in FIG. 9, a manufacturer applies photoresist (PR) 240 to the upper surface of the PVA 220 formed with the pattern corresponding to the linear grid. There are two kinds of photoresist (PR) 240, such as negative PR and positive PR, and one of them is selected in accordance with processes.

These two kinds of PR are different from each other in a reaction against ultraviolet rays. Molecular binding of the negative PR becomes stronger when exposed to ultraviolet rays, but molecular binding of the positive PR becomes weaker when exposed to ultraviolet rays. That is, the negative PR hardens but the positive PR decomposes when they are exposed to ultraviolet rays.

Figure 10:
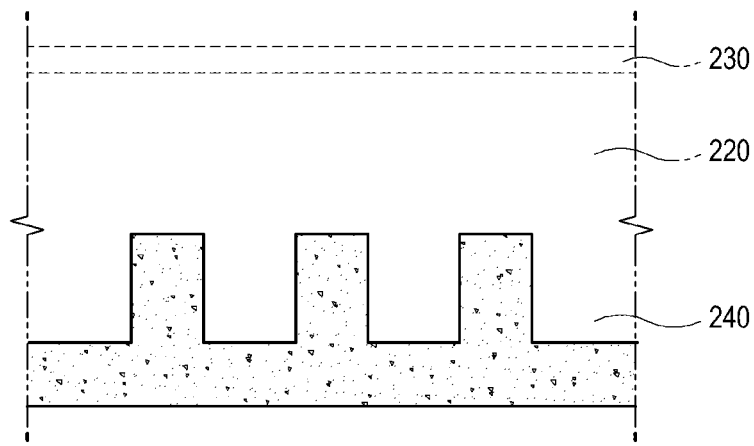

As illustrated in FIG. 10, a manufacturer turns the PR 240 down, and removes the PVA 220 and the carrier 230 from the PR 240. Since the PVA 220 is water-soluble, the PVA 220 is easily washed out by water from the PR 240. If the PVA 220 and the carrier 230 are removed, the upper surface of the PR 240 is formed with the same pattern as the linear grid pattern previously formed on the master mold 210 (see FIG. 7). Eventually, the pattern template of the linear grid including the PR 240 is manufactured.

Below, a method of transferring the linear grid pattern on the substrate by the pattern template of the linear grid will be described. As the method of transferring the linear grid pattern, etching using gas may be generally used.

FIG. 11 to FIG. 14 illustrate an example method of transferring a linear grid pattern. In this example embodiment, the method of forming the linear grid having the two-layered structure will be described. However, this example embodiment may also be applicable to a method of forming the linear grid having the one-layered or three-layered structure.

Figure 11:
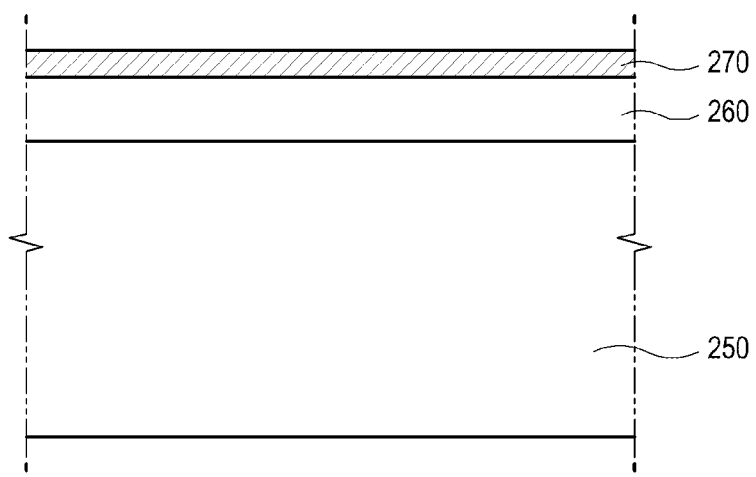
FIG. 11 to FIG. 14 illustrate an example method of transferring a linear grid pattern.

As illustrated in FIG. 11, a manufacturer sequentially laminates a metal layer 260 and a dielectric layer 270 on a substrate 250. The substrate 250 may, for example, be one of the upper substrate and the lower substrate of the display panel, and includes a transparent material through which light can pass.

Figure 12:
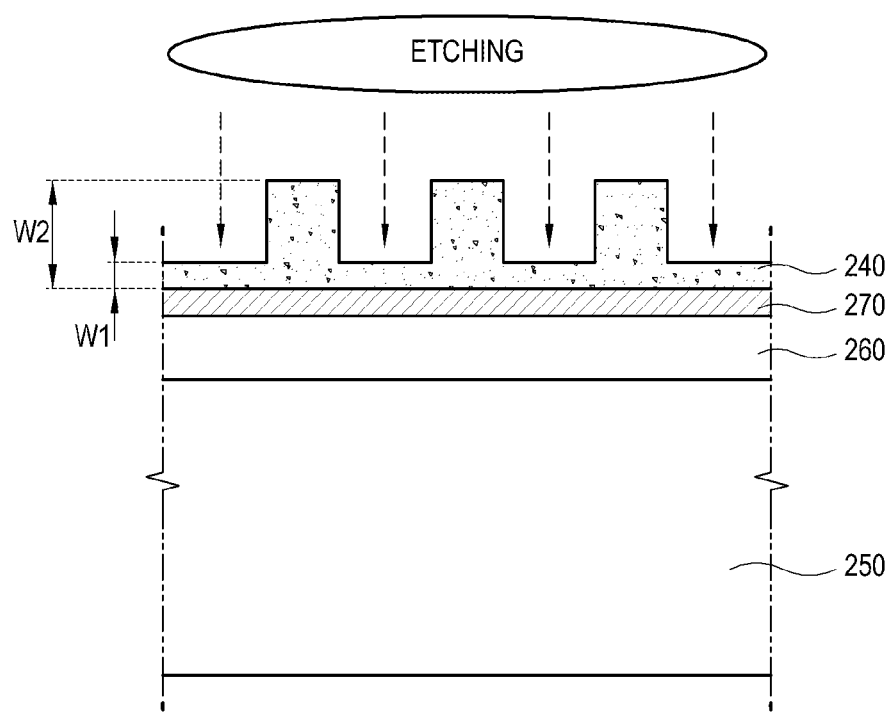

As illustrated in FIG. 12, a manufacturer laminates a pattern template 240 on the dielectric layer 270. At this time, the manufacturer turns the pattern template 240 over so that the surface formed with the linear grid pattern can face upward. In such a laminated state, the manufacturer injects gas for etching the dielectric layer 270 so that the dielectric layer 270 can be etched.

The pattern template 240 includes a thin area and a thick area. The former will be represented by w1, and the latter will be represented by w2. Etching gas may be also used for etching the pattern template 240 to some extent. In an area w1, the pattern template 240 and the dielectric layer 270 are etched by the etching gas. However, in an area w2, not the dielectric layer 270 but only an upper portion of the pattern template 240 is etched. This is because w2 is thicker than w1. The etching gas cannot permeate the dielectric layer 270 in the area w2.

If w1 is so thick that the etching gas cannot permeate the dielectric layer 270, the etching is not performed. Therefore, w1 is determined based on the ability of the etching gas when the pattern template 240 is manufactured.

Figure 13:
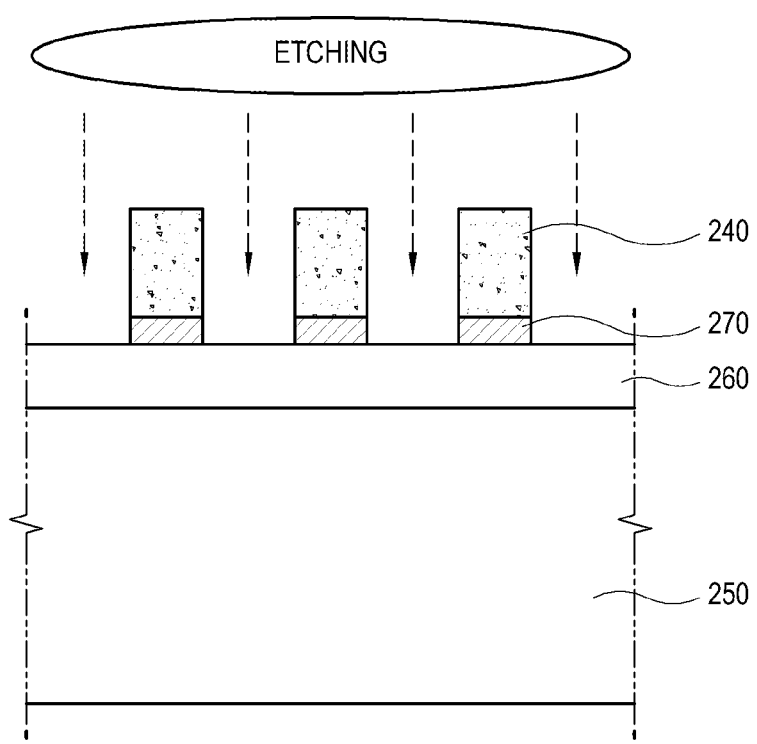

As illustrated in FIG. 13, when the dielectric layer 270 is completely etched, an area where the dielectric layer 270 is removed and the metal layer 260 is exposed and an area where the pattern template 240 is left on the dielectric layer 270 alternately appear. In this stage, the metal layer 260 remains since it does not react with the etching gas and is not etched in the previous stage.

In this state, a manufacturer injects etching gas for etching the metal layer 260. This etching gas reacts with only the metal layer 260, and therefore etching is performed with regard to the area where the metal layer 260 is exposed and not the area where the dielectric layer 270 and the pattern template 240 remain.

Figure 14:
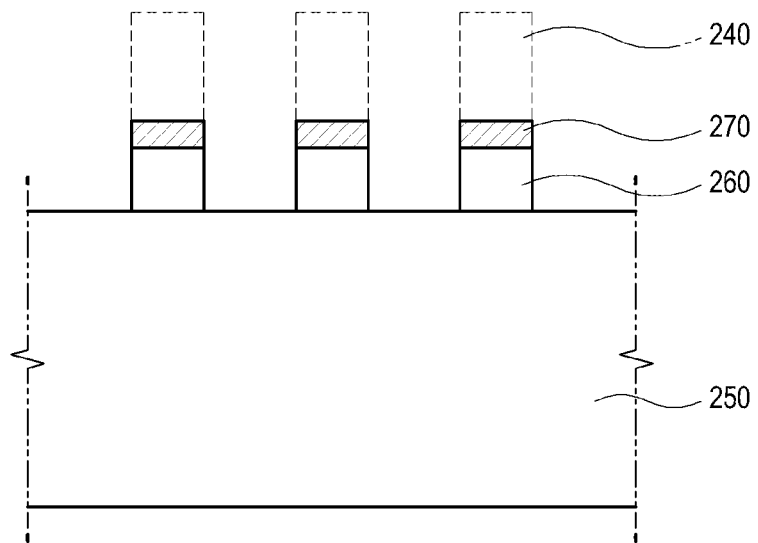

As illustrated in FIG. 14, a manufacturer removes the residual pattern template 240 when the metal layer 260 is completely etched. Eventually, the linear grid pattern having the two-layered structure of the metal layer 260 and the dielectric layer 270 is formed on the substrate 250.

When such a linear grid is manufactured, the master mold is first manufactured corresponding to the size of the substrate 250 and the pattern template is manufactured from the master mold and transferred to the substrate 250. In terms of productivity, it is advantageous to transfer the linear grid pattern from the master mold to the whole area of the substrate 250 at once rather than divisionally and sequentially forming the linear grid pattern corresponding to the areas of the substrate 250.

In this regard, a method of manufacturing a master mold for forming a linear grid pattern on a substrate for a large screen will be described below.

Figure 15:
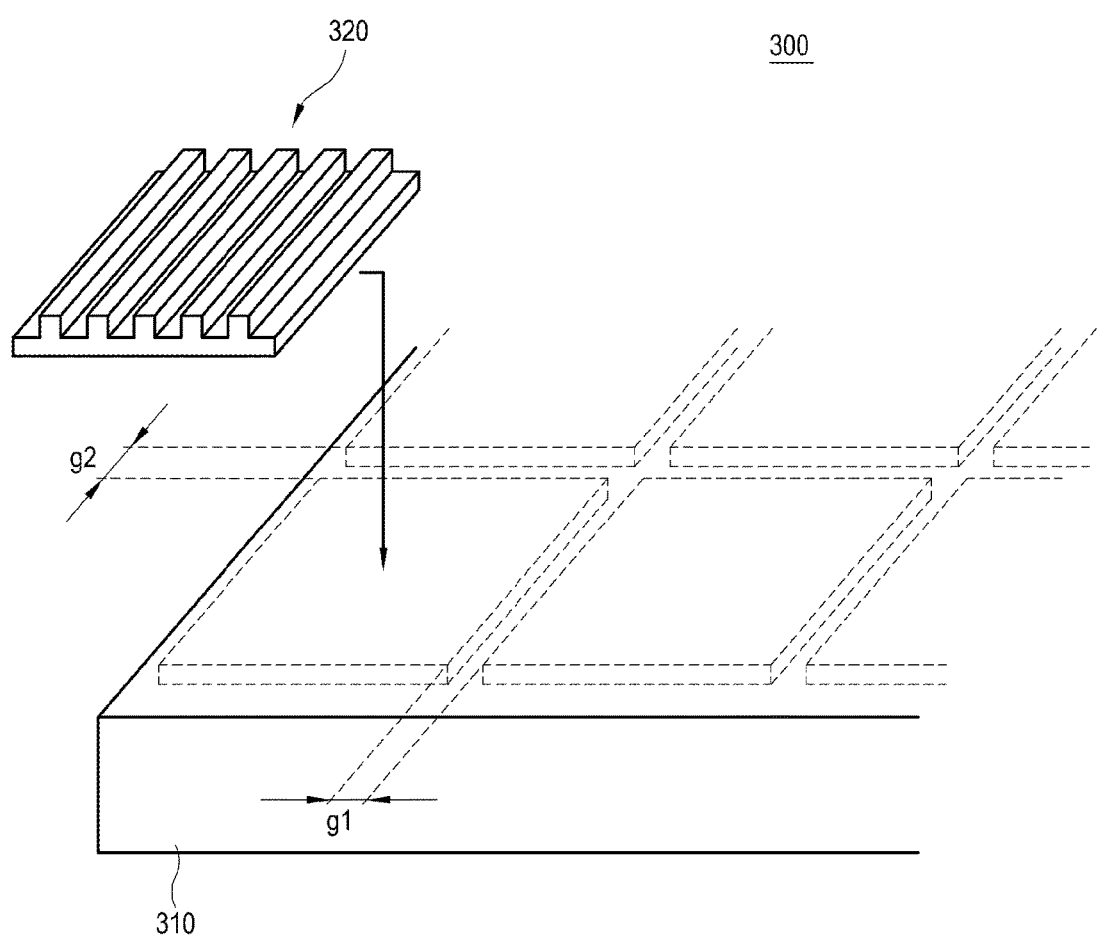
FIG. 15 illustrates an example method of manufacturing a master mold.

FIG. 15 illustrates an example method of manufacturing a master mold 300;

As illustrated in FIG. 15, a manufacturer prepares a crystal substrate 310 having a size corresponding to the substrate of the display panel to which the linear grid pattern will be transferred. The manufacturer laminates a sub mold 320, which has a predetermined size and is formed with the linear grid pattern on the crystal substrate 310.

The sub mold 320 is a mold made of silicon and formed with the linear grid pattern on one side thereof. Since the sub mold 320 is manufactured by E-beam semiconductor equipment, the size of the sub mold 320 is limited to a wafer size, for example, has a diagonal length of 18 inches. The reason why the linear grid pattern is not directly formed on the crystal substrate 310 by the semiconductor equipment is because the size of the crystal substrate 310 goes beyond the bounds controllable by the semiconductor equipment. Therefore, a manufacturer forms the linear grid pattern on the substrate in units of a predetermined unit size by the semiconductor equipment, thereby manufacturing the sub mold 320.

A manufacturer attaches a plurality of sub molds 320 one by one to the crystal substrate 310 in the form of tiles, so that the plurality of sub molds 320 can form the linear grid pattern on one entire side of the crystal substrate 310. Such a manufacturing method is called a tiling process. Thus, the linear grid pattern extended in one direction is formed on the whole upper surface of the crystal substrate 310 by a set of sub molds 320, thereby manufacturing the master mold 300.

The master mold 300 may have discontinuity in the areas g1 and g2 between two adjacent sub molds 320 due to the foregoing tiling process. Although the sub mold 320 is precisely manufactured, the bars of the linear grid may be spaced beyond an allowable error and misaligned with regard to an extending direction in the corresponding areas g1 and g2 since the linear grid of the sub mold 320 has a fine structure of nano scale. If the linear grid pattern is transferred from the master mold 300 having the discontinuity to the substrate of the display panel, this display panel ultimately displays a distorted image.

If the linear grid pattern is formed on the crystal substrate 310 directly instead of the tiling process in which the plurality of sub molds 320 are attached one by one, the foregoing problems may be reduced and/or eliminated. However, as described above, there is a limit to the size of the substrate on which the linear grid may be formed by the semiconductor equipment, and the size of the actually manufactured display panel exceeds this limit. Therefore, in terms of manufacturing environments, it is difficult for the semiconductor equipment to directly form the linear grid pattern on the large crystal substrate 310 as opposed to manufacturing the sub mold 320.

The tiling process of the foregoing example embodiment is not suitable for a display panel of a large screen when the quality of the display panel is taken into account.

Below, an example embodiment for reducing the foregoing discontinuity when the master mold is manufactured will be described.

FIG. 16 to FIG. 21 illustrate an example method of manufacturing a master mold having reduced discontinuity.

Figure 16:
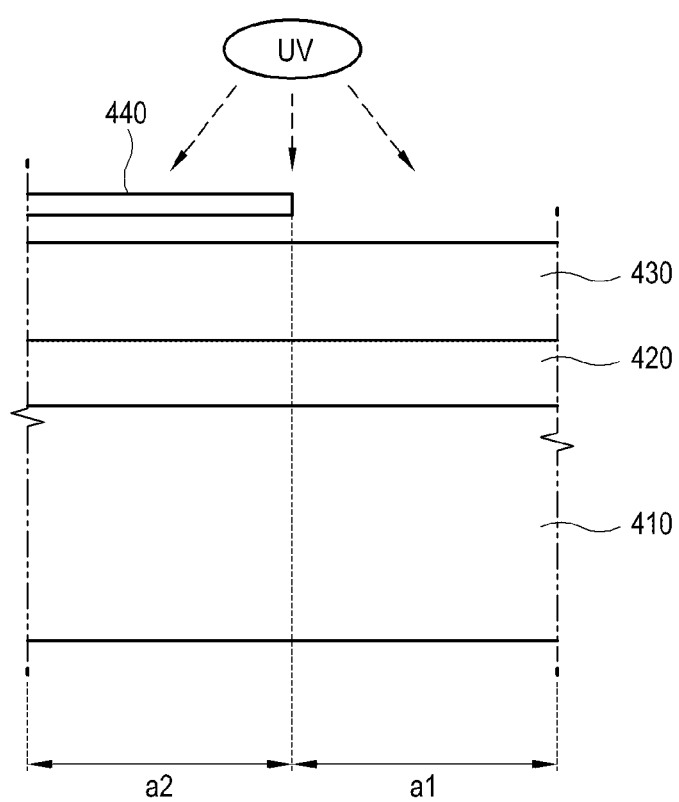
FIG. 16 to FIG. 21 illustrate an example method of manufacturing a master mold.

As illustrated in FIG. 16, a manufacturer forms a pattern forming layer 420 on the crystal substrate 410. The pattern forming layer 420 may be made of silicon or other various materials, and will be used to form the linear grid pattern on the master mold.

A manufacturer laminates the protective PR layer 430 on the pattern forming layer 420. The protective PR layer 430 includes positive PR.

In the following description, a right area in the drawings will be referred to as a first area a1 and a left area will be referred to as a second area a2. Below, it will be described that the linear grid pattern corresponding to the first area a1 is first formed and the linear grid pattern corresponding to the second area a2 is then formed. By repeating these processes, it is possible to form the linear grid pattern on the entire area of the crystal substrate 410.

A manufacturer covers the second area a2 with a mask 440 for blocking ultraviolet rays. There are no limits to the material and kind of the mask 440 as long as it can block the ultraviolet rays.

A manufacturer applies ultraviolet rays throughout the first area a1 and the second area a2. Since the positive PR decomposes reacting with the ultraviolet rays, the protective PR layer 430 is removed in the first area a1 by the ultraviolet rays, thereby exposing the pattern forming layer 420 to the outside. On the other hand, the protective PR layer 430 remains in the second area a2 covered with the mask 440 for blocking ultraviolet rays. In this state, the manufacturer removes the mask 440.

Figure 17:
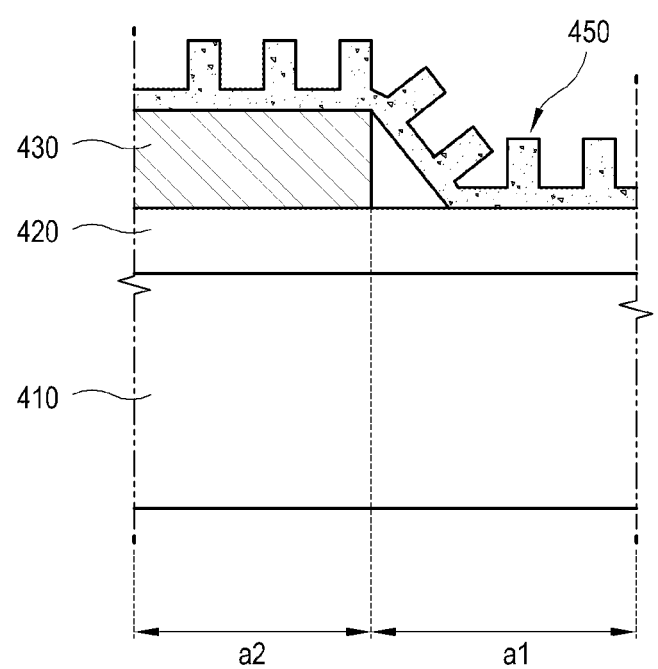

As illustrated in FIG. 17, the manufacturer laminates the pattern template 450 on the first area a1 and the second area a2. The pattern template 450 is larger than at least the first area a1 and the second area a2 and made using the sub mold 320 (see FIG. 15) manufactured by the semiconductor equipment or the like.

Since the uppermost layer in the first area a1 is the pattern forming layer 420 and the uppermost layer in the second area a2 is the protective PR layer 430, the pattern template 450 is laminated leaving height difference on the pattern forming layer 420 of the first area a1 and the protective PR layer 430 of the second area a2.

In this state, a manufacturer injects gas for etching the pattern forming layer 420. In the first area a1, this gas etches the pattern forming layer 420 of an area where the pattern template 450 is relatively thin. On the other hand, in the second area a2, this gas etches the pattern template 450 but does not etch the pattern forming layer 420 covered by the protective PR layer 430.

Figure 18:
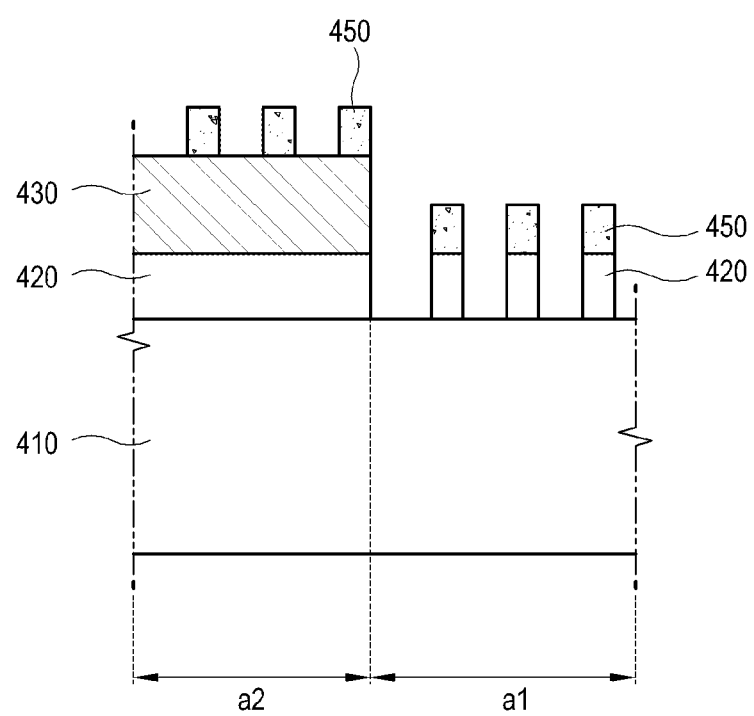

As illustrated in FIG. 18, if the etching is completed in the first area a1, the pattern template 450 not etched remains on the first area a1 and the second area a2. Beneath the pattern template 450, the first area a1 has the linear grid pattern of the pattern forming layer 420, and the second area a2 has the pattern forming layer 420 unchanged due to the protective PR layer 430.

Figure 19:
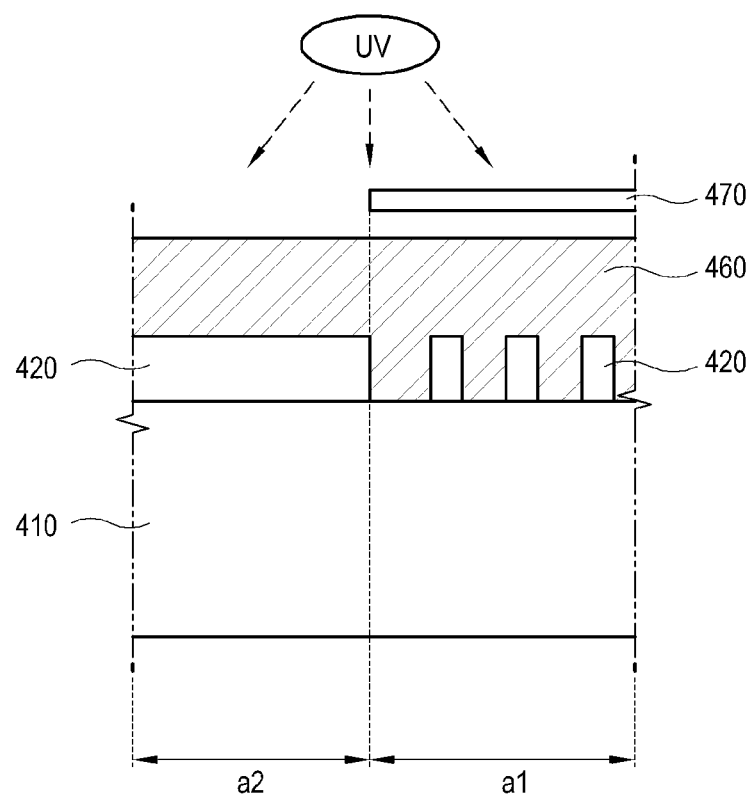

As illustrated in FIG. 19, a manufacturer removes the pattern template 450 (see FIG. 18) and the protective PR layer 430 (see FIG. 18), and applies a protective PR layer 460 to the first area a1 and the second area a2. The protective PR layer 460 includes the same positive PR as the foregoing protective PR layer 430.

A manufacturer covers the first area a1 with a mask 470 for blocking ultraviolet rays. This mask 470 has the same functions as the foregoing mask 440 (see FIG. 16).

In this state, a manufacturer applies ultraviolet rays to the first area a1 and the second area a2. Thus, the protective PR layer 460 corresponding to the first area a1 maintains its original form since it is protected by the mask 470 from ultraviolet rays. On the other hand, the protective PR layer 460 corresponding to the second area a2 is directly exposed to the ultraviolet rays and thus removed, so that the pattern forming layer 420 in the second area a2 can be exposed to the outside. After the exposure to the ultraviolet rays, the manufacturer removes the mask 470.

Figure 20:
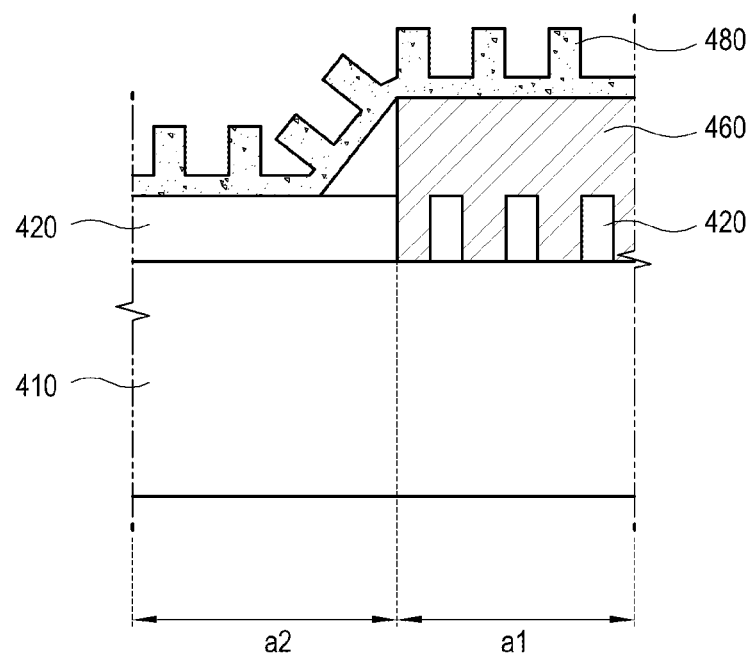

As illustrated in FIG. 20, a manufacturer laminates a pattern template 480 on the first area a1 and the second area a2. The pattern template 480 is laminated leaving height difference between the first area a1 and the second area a2 due to the protective PR layer 460 of the first area a1.

In this state, a manufacturer injects etching gas. In the second area a2, the etching gas etches an area where the pattern template 480 is relatively thin, and etches the pattern forming layer 420 of the corresponding area. However, in the first area a1, the etching is blocked by the protective PR layer 460 provided on the pattern forming layer 420 even though the etching gas is applied to the pattern template 480.

After the etching process, a manufacturer removes the residual the pattern template 480 and the protective PR layer 460.

Figure 21:
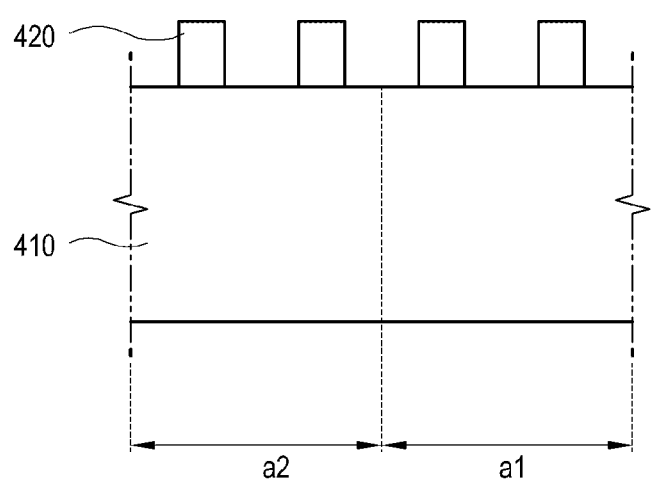

As illustrated in FIG. 21, when the foregoing processes are completed, the linear grid pattern is formed by etching the pattern forming layer 420 of the first area a1 and the second area a2 on the crystal substrate 410. As these processes are performed throughout the areas of the substrate 410, a manufacturer can manufacture the master mold capable of transferring the linear grid corresponding to the display panel for the large screen.

Figure 22:
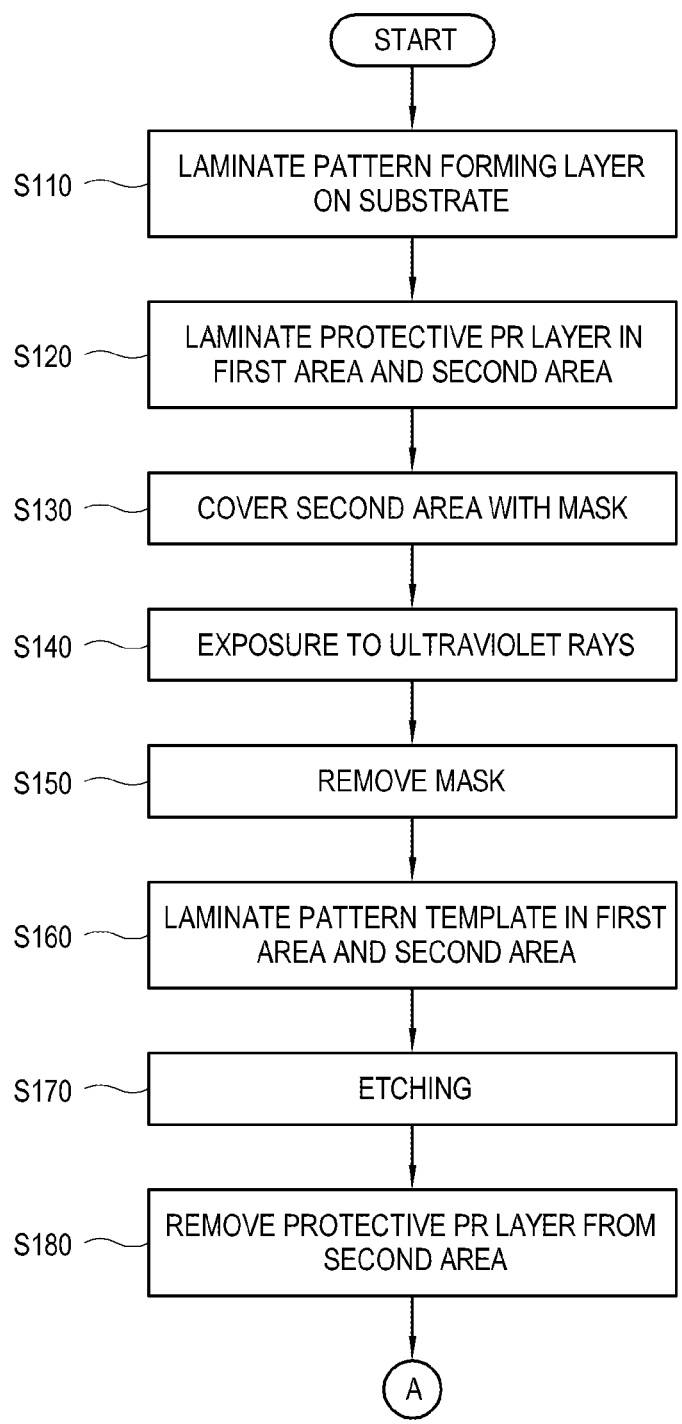
FIG. 22 and FIG. 23 are flowcharts illustrating the example method of manufacturing the master mold of FIG. 16 to FIG. 21.
Figure 23:
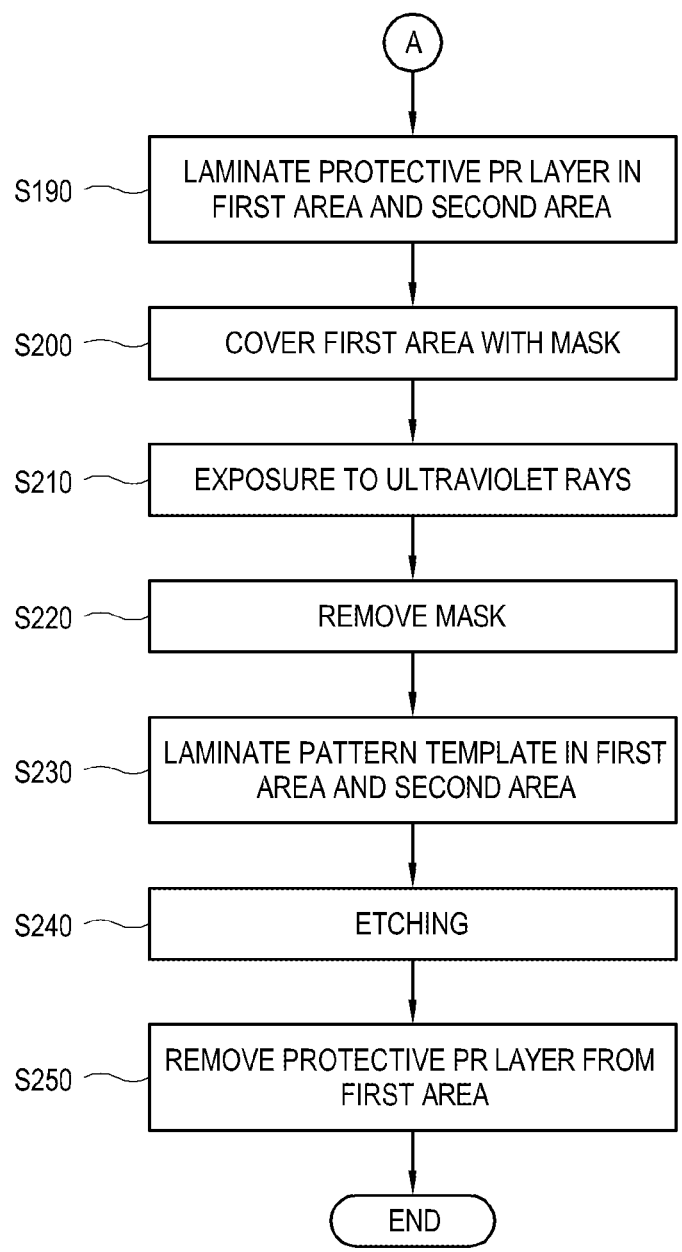

FIG. 22 and FIG. 23 are flowcharts illustrating the example method of manufacturing the master mold described above.

Referring to FIG. 22, at operation S110 a manufacturer laminates the pattern forming layer on the substrate.

At operation S120 a manufacturer applies the protective PR layer to the first area where the linear grid pattern will be formed in the pattern forming layer and to the second area adjacent to the first area. This protective PR layer includes the positive PR.

At operation S130 a manufacturer covers the second area with the mask. The mask serves to block ultraviolet rays.

At operation S140 a manufacturer applies ultraviolet rays. Thus, the protective PR layer is removed from only the first area but remains in the second area.

At operation S150 a manufacturer removes the mask.

At operation S160 a manufacturer laminates the pattern template on the first area and the second area. The pattern template includes the linear grid pattern.

At operation S170 a manufacturer performs etching. By the etching, the linear grid pattern is formed in the pattern forming layer of the first area.

At operation S180 a manufacturer removes the protective PR layer of the second area.

Referring to FIG. 23, at operation S190 a manufacturer laminates the protective PR layer again on the first area and the second area.

At operation S200 a manufacturer covers the first area with the mask.

At operation S210 a manufacturer applies ultraviolet rays. Thus, the protective PR layer remains in the first area, but the protective PR layer is removed and the pattern forming layer is exposed to the outside in the second area.

At operation S220 a manufacturer removes the mask.

At operation S230 a manufacturer laminates the pattern template on the first area and the second area.

At operation S240 a manufacturer performs etching. By the etching, the linear grid pattern is formed in the pattern forming layer of the second area.

At operation S250 a manufacturer removes the protective PR layer of the first area. Thus, the first area and the second area have the linear grid pattern. By repeating the foregoing operations with regard to the respective areas throughout the substrate, it is possible to manufacture a master mold having a large linear grid pattern.

To aid in understanding the method according to an example embodiment, the drawings are schematically and simply rendered. However, there may be discontinuity in between the first area and the second area even when the master mold is manufactured according to an example embodiment. Although the discontinuity according to this example embodiment is less than that according to the tiling example of FIG. 15, the discontinuity may go beyond the allowable error of the display panel since actual processes are achieved in nano scale.

Figure 24:
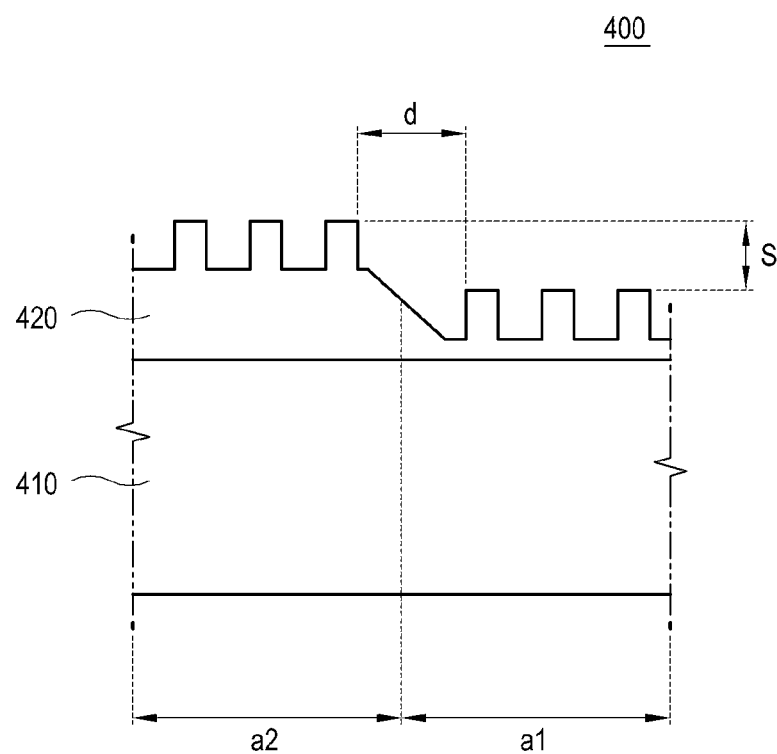
FIG. 24 illustrates an example of discontinuity between a first area and a second area in the example master mold of FIG. 16 to FIG. 21.

FIG. 24 illustrates an example of discontinuity between a first area a1 and a second area a2 in the master mold 400 manufactured according to the example embodiment described in FIG. 16 to FIG. 23.

As illustrated in FIG. 24, the master mold 400 is formed by laminating the pattern forming layer 420 having the linear grid pattern on the substrate 410. Here, there may be two kinds of discontinuity in between the first area a1 and the second area a2 of the pattern forming layer 420. One is that a distance d between the leftmost bar of the linear grid pattern in the first area a1 and the rightmost bar of the linear grid pattern in the second area a2 goes beyond an allowable error, and the other is that height difference S in between the linear grid pattern in the first area a1 and the linear grid pattern in the second area a2 goes beyond an allowable error, The discontinuity is caused by the height difference between the first area a1 and the second area a2 due to the protective PR layer 430, 460 in the foregoing process. That is, while the linear grid pattern is sequentially formed in the first area a1 and the second area a2, the protective PR layers 430 and 460 may cause the pattern template 450 and 480 to be different in height between the first area a1 and the second area a2. Since the etching is performed in this state, the discontinuity may occur as illustrated in FIG. 24.

To make the discontinuity be within the allowable error, the protective PR layer 430, 460 has to be as thin as possible. However, it is difficult and costs high to make the protective PR layer 430, 460 thin. On the other hand, a relatively thick protective PR layer is easily manufactured and costs low, but causes discontinuity remarkably.

Thus, a method of manufacturing a master mold, discontinuity of which is more reduced than that according to the above example embodiment, will be described below.

Figure 25:
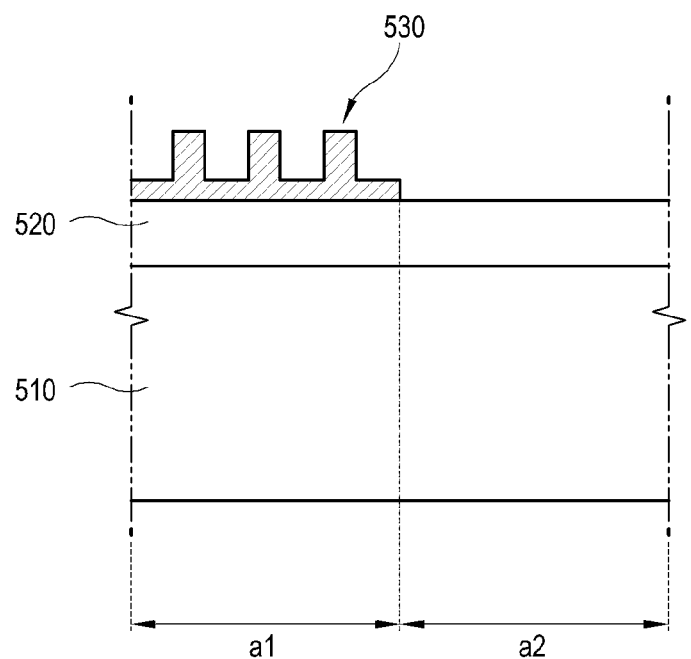
FIG. 25 to FIG. 29 illustrate an example method of manufacturing a master mold.

FIG. 25 to FIG. 29 illustrate an example method of manufacturing a master mold according to another example embodiment;

As illustrated in FIG. 25, a manufacturer laminates a pattern forming layer 520 on a crystal substrate 510. The pattern forming layer 520 is formed by sputtering a substance such as silicon (Si) or silica (SiO2) on to the substrate 510.

A manufacturer divides the pattern forming layer 520 into the first area a1 and the second area a2. Since the first area a1 and the second area a2 are nothing but a plurality of areas sectioned on the pattern forming layer 520 for convenience, their terms do not limit the areas or positions. For reference, the first area a1 and the second area a2 are adjacent to each other on the upper surface of the pattern forming layer 520.

First, a manufacturer laminates a first pattern template 530 on the first area a1. The first pattern template 530 includes negative PR as a template having a predetermined area where the linear grid pattern is formed.

Figure 26:
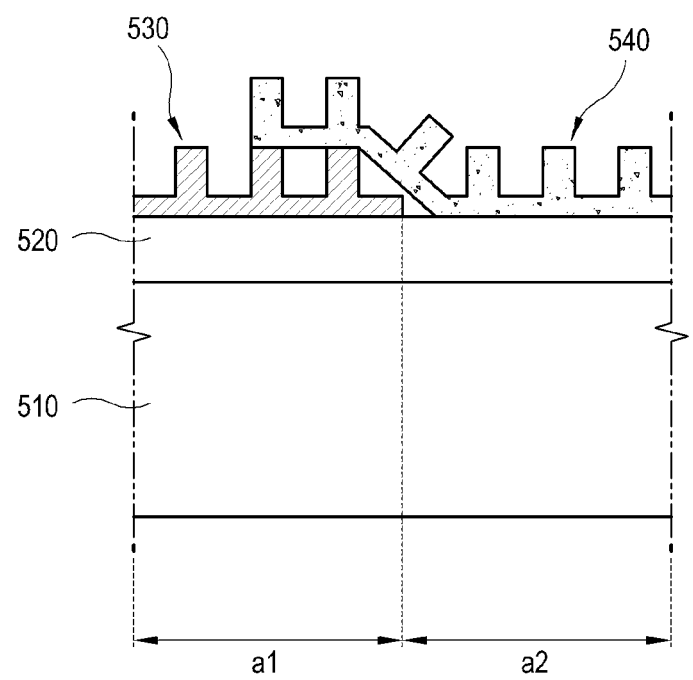

As illustrated in FIG. 26, a manufacturer laminates a second pattern template 540 on the second area a2. The second pattern template 540 includes positive PR as a template having a predetermined area where the linear grid pattern is formed.

The first pattern template 530 and the second pattern template 540 are the same in that they are the templates having the linear grid pattern, but different in that the former includes the negative PR and the latter includes the positive PR.

Here, a manufacturer laminates the second pattern template 540 and the first pattern template 530 so that their edges are overlapped with each other. That is, the second pattern template 540 is provided on the second area a2 while the edge of the second pattern template 540 gets out of the second area a2 and is overlapped with the edge of the first pattern template 530. In FIG. 26, a left edge portion of the second pattern template 540 is overlapped with a right edge portion of the first pattern template 530.

As the edge of the second pattern template 540 is overlapped with the edge of the first pattern template 530, it is possible to reduce an empty space between the linear grids between the first area a1 and the second area a2 so far as possible. Although it is impossible to entirely eliminate such an empty space in accordance with nano-scale processes, a manufacturer can make the corresponding empty space be at least within the allowable error on the contrary to those of the previous example embodiments.

Figure 27:
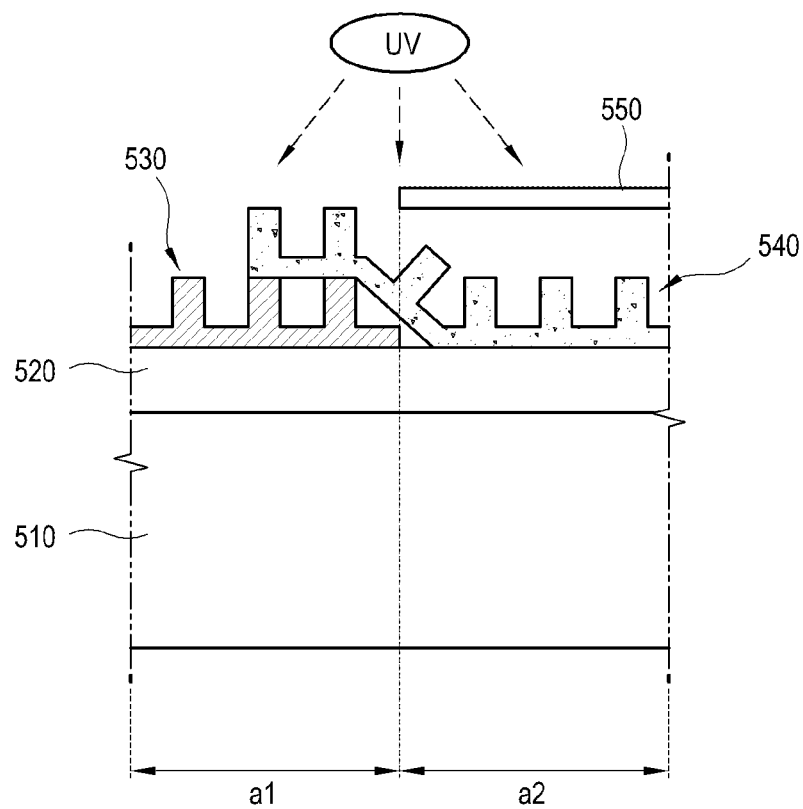

As illustrated in FIG. 27, a manufacturer covers the second area a2 with a mask 550 for blocking ultraviolet rays. For reference, a manufacturer covers not the whole of the second pattern template 540 but a part of the second pattern template 540 corresponding to the second area a2. This means that the edge portion of the second pattern template 540 overlapped with the edge portion of the first pattern template 530 is not covered with the mask 550.

A manufacturer applies ultraviolet rays to the first area a1 and the second area a2. Since the first pattern template 530 is negative PR, molecular binding of the first pattern template 530 becomes stronger and keeps its original shape when exposed to ultraviolet rays. A portion of the second pattern template 540 corresponding to the second area a2 covered with the mask 550 keeps its original shape since the mask 550 blocks the ultraviolet rays. On the other hand, the edge portion of the second pattern template 540 not covered with the mask 550, i.e. covering the first pattern template 530 is removed since it decomposes when exposed to the ultraviolet rays. This is because the second pattern template 540 is the positive PR.

After the exposure to the ultraviolet rays, a manufacturer removes the mask 550.

Figure 28:
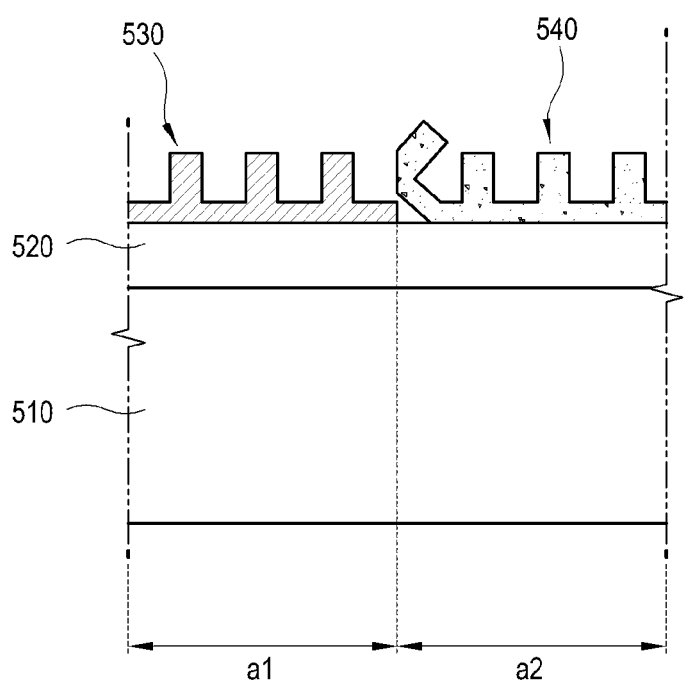

As illustrated in FIG. 28, the first pattern template 530 is laminated on the pattern forming layer 520 corresponding to the first area a1, and the second pattern template 540 is laminated on the pattern forming layer 520 corresponding to the second area a2. In this state, the first pattern template 530 and the second pattern template 540 have substantially the same height. Although the left edge of the second pattern template 540 is partially extended over the first pattern template 530, this extension is allowable in the nano-scale process.

In this state, a manufacturer injects the etching gas. The etching gas etches a relatively thin portion of the first pattern template 530 and the second pattern template 540 and then etches the pattern forming layer 520. On the other hand, a relatively thick portion of the first pattern template 530 and the second pattern template 540 prevents the etching gas from reaching the pattern forming layer 520 even though they are etched by the etching gas.

After the etching process, a manufacturer removes residues of the first pattern template 530 and the second pattern template 540.

Figure 29:
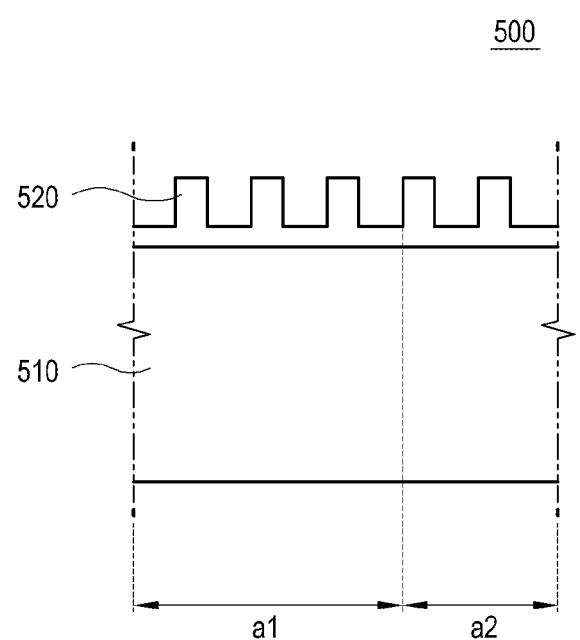

As illustrated in FIG. 29, the linear grid pattern is formed on the first area a1 and the second area a2 after the foregoing processes are completed. Then, a manufacturer repeats the foregoing processes throughout the areas the pattern forming layer 520, thereby manufacturing a master mold 500 formed with the linear grid pattern on the entire pattern forming layer 520 of the substrate 510.

According to this example embodiment, a manufacturer laminates the pattern template of the negative PR on the first area, and laminates the pattern template of the positive PR having the same height on the second area adjacent to the first area while the edge portion of the positive PR pattern template overlaps the negative PR pattern template at an edge of the first area. A manufacturer covers the second area with the mask and applies ultraviolet rays to those areas, thereby removing the overlapped portion and etching both the first area and the second area.

Therefore, according to this example embodiment, the master mold is manufactured under the condition that its height difference or seam line between the areas is within an allowable error in terms of quality. In addition, it is possible to improve the linear grid pattern of the display panel manufactured using the master mold, and improve image quality of the display panel.

Figure 30:
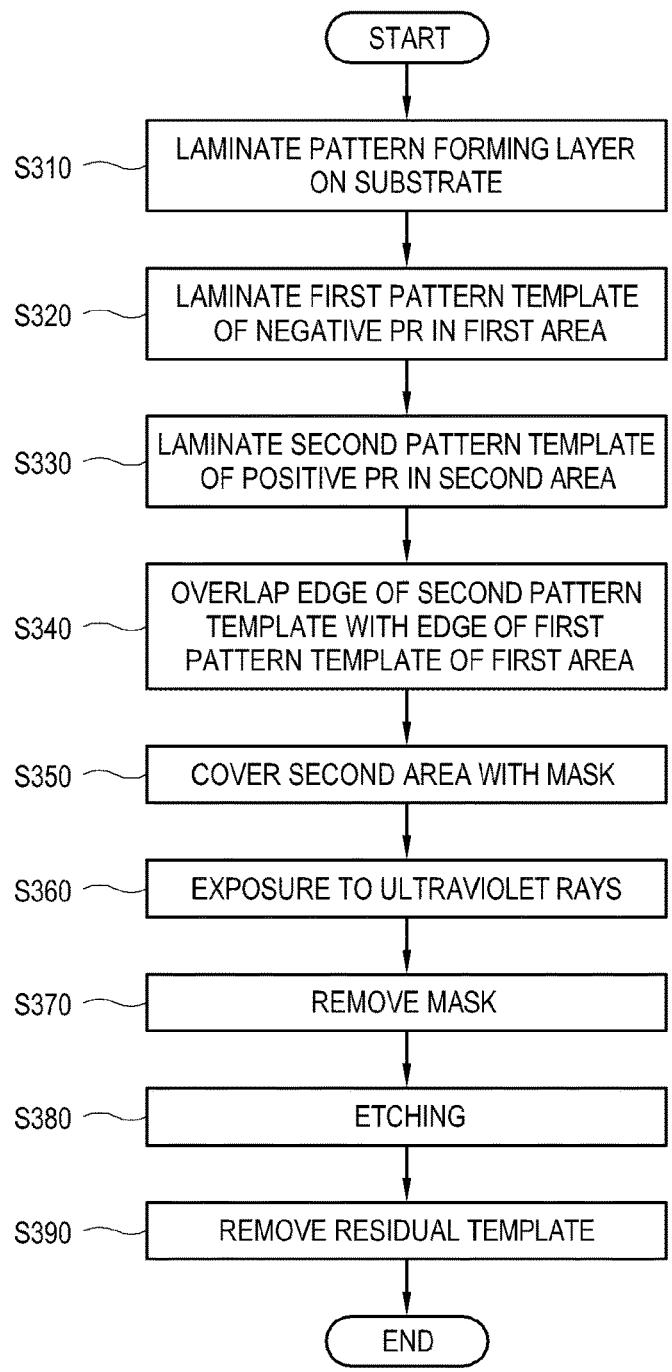
FIG. 30 is a flowchart illustrating an example method of manufacturing the master mold of FIG. 25 to FIG. 29.

FIG. 30 is a flowchart illustrating an example method of manufacturing the master mold according to the example embodiment illustrated in FIG. 25 to FIG. 29.

As illustrated in FIG. 30, at operation S310 a manufacturer laminates the pattern forming layer on the substrate.

At operation S320 a manufacturer laminates the first pattern template of the negative PR on the first area of the pattern forming layer. The first pattern template includes the linear grid pattern.

At operation S330 a manufacturer laminates the second pattern template including the positive PR on the second area adjacent to the first area of the pattern forming layer. The second pattern template has the same linear grid pattern as the first pattern template, but is different in materials from the first pattern template.

At operation S340 a manufacturer makes an edge of the second pattern template to overlap an edge of the first pattern template on the first area. Thus, the edge of the second pattern template extends out of the second area in the direction of the first area.

At operation S350 a manufacturer covers the second area with a mask for blocking ultraviolet rays.

At operation S360 a manufacturer applies the ultraviolet rays to the first area and the second area. Then, the edge portion of the second pattern template overlapping the edge of the first pattern template on the first area is removed by the ultraviolet rays.

At operation S370 a manufacturer removes the mask.

At operation S380 a manufacturer performs etching. At operation S390 residual templates are removed after the etching, thereby forming the linear grid pattern the first area and the second area. These processes are applied throughout the pattern forming layer, thereby manufacturing the master mold capable of transferring the linear grid pattern for a large screen.

It will be appreciated that the operations according to this example embodiment are fewer than those of the previous example embodiment. For example, the instant example embodiment is relatively improved in productivity and quality of the master mold since the discontinuity such as the height difference or the seam line is reduced while reducing the number of operations.

Figure 31:
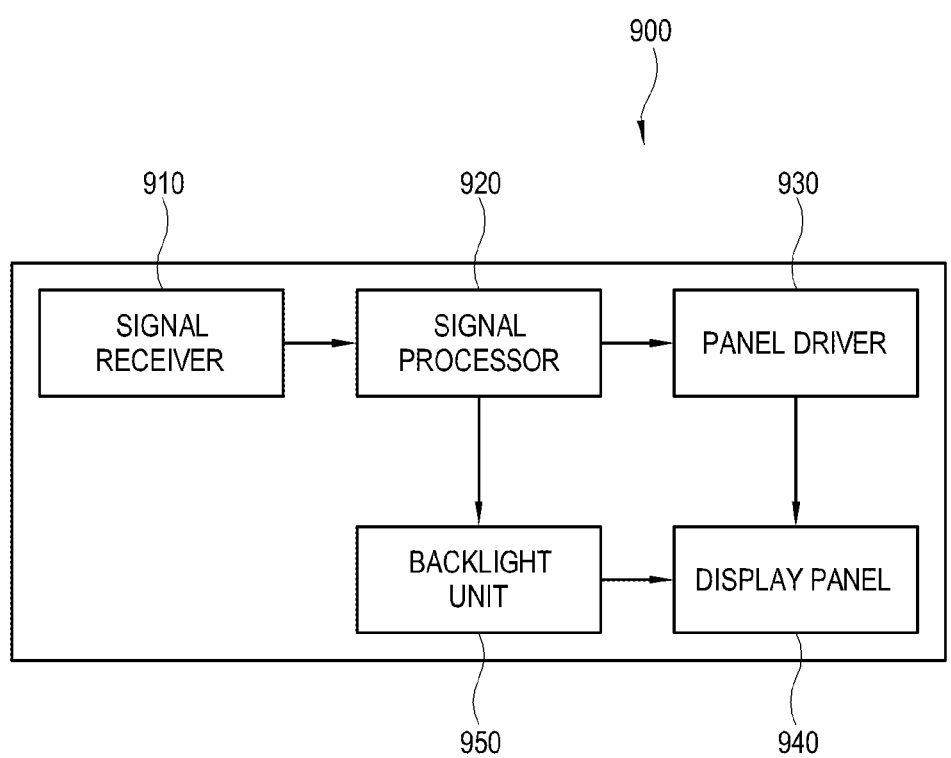
FIG. 31 is a block diagram illustrating an example display apparatus.

FIG. 31 is a block diagram illustrating an example display apparatus 900.

As illustrated in FIG. 31, the display apparatus 900 may, for example, include a signal receiver 910 for receiving an image signal, a signal processor 920 for processing the image signal received in the signal receiver 910 in accordance with preset image processing processes, a panel driver 930 for outputting a driving signal corresponding to the image signal processed by the signal processor 920, a display panel 940 for displaying an image based on the image signal in response to the driving signal from the panel driver 930, and a backlight unit 950 for illuminating the display panel 940 in accordance with the image signal processed by the signal processor 920.

In this example embodiment, the display apparatus 900 may be achieved by various devices such as a TV, a monitor, a portable media player, a mobile phone or the like capable of displaying an image.

The signal receiver 910 receives an image signal/image data and transmits it to the signal processor 920. The signal receiver 910 may be provided variously in accordance with the formats of the image signal to be received and the types of the display apparatus 900. For example, the signal receiver 910 may receive a radio frequency (RF) signal from a broadcasting station (not shown), or may receive an image signal based on composite video, component video, super video, Syndicat des Constructeurs d'Appareils Radiorécepteurs et Téléviseurs (SCART), high definition multimedia interface (HDMI), DisplayPort, unified display interface (UDI), wireless HD standards, etc.

If the image signal is a broadcast signal, the signal receiver 910 may include a tuner to be tuned to a channel for the broadcast signal. Alternatively, the signal receiver 910 may receive an image data packet from a server (not shown) through a network.

The signal processor 920 performs various image processing processes with regard to the image signal received in the signal receiver 910. The signal processor 920 outputs the processed image signal to the panel driver 930 so that the display panel 940 can display an image based on the corresponding image signal.

The kind of image processing processes performed by the signal processor 920 may for example include decoding corresponding to formats of the image data, de-interlacing for converting interlaced image data into progressive image data, scaling for adjusting image data to have a preset resolution, noise reduction for improving image quality, detail enhancement, frame refresh rate conversion, etc.

The signal processor 120 may be built in the display apparatus 900 in the form of a system-on-chip (SoC) where various functions corresponding to such processes are integrated, or an image processing board (not shown) where individual elements for independently performing each of the processes are mounted to a printed circuit board.

The panel driver 930, the display panel 940 and the backlight unit 950 are substantially the same as those discussed above, and thus detailed descriptions thereof will be omitted.

The methods according to the foregoing example embodiments may be achieved in the form of a program command that can be implemented in various computers, and recorded in a computer readable medium. Such a computer readable medium may include a program command, a data file, a data structure or the like, or combination thereof. For example, the computer readable medium may be stored in a volatile or nonvolatile storage such as a read only memory (ROM) or the like, regardless of whether it is deletable or rewritable, for example, a RAM, a memory chip, a device or integrated circuit (IC) like memory, or an optically or magnetically recordable or machine (e.g., a computer)-readable storage medium, for example, a compact disk (CD), a digital versatile disk (DVD), a magnetic disk, a magnetic tape or the like. It will be appreciated that a memory, which can be included in a mobile terminal, is an example of the machine-readable storage medium suitable for storing a program having instructions for materializing the example embodiments. The program command recorded in this storage medium may be specially designed and configured according to the example embodiments, or may be publicly known and available to those skilled in the art of computer software.

Although example embodiments have been illustrated and described, it will be appreciated by those skilled in the art that changes may be made in these example embodiments without departing from the principles and spirit of the disclosure, the scope of which is defined in the appended claims and their equivalents.

What is claimed is:

1. A method of manufacturing a linear grid on a substrate to form a linear grid pattern of a display panel, the method comprising:
   laminating a negative photoresist layer over a first area of a pattern forming layer disposed over a substrate, the negative photoresist layer comprising a pre-pattern corresponding to a linear grid pattern to be formed of the pattern forming layer;
   laminating a first portion of a positive photoresist layer over a second area of the pattern forming layer and a second portion of the positive photoresist layer on at least a portion of the negative photoresist layer laminated over the first area, the first portion and the second portion of the positive photoresist layer having the pre-pattern;

covering the second area with a mask;

removing the second portion of the positive photoresist by exposing with ultraviolet rays the second portion of the positive photoresist layer;

removing the mask; and forming the linear grid pattern by etching the negative photoresist layer laminated over the first area, the first portion of the positive photoresist layer laminated over the second area, and the pattern forming layer.

2. The method according to claim 1, wherein the negative photoresist hardens when exposed to the ultraviolet rays, and the second portion of the positive photoresist layer decomposes when exposed to the ultraviolet rays.

3. The method according to claim 1, wherein the pattern forming layer comprises silicon or silica.

4. The method according to claim 1, wherein the etching is performed by injecting etching gas on to the pre-pattern of the negative photoresist layer, the pre-pattern of the first portion of positive photoresist layer, and the pattern forming layer.

5. The method according to claim 4, wherein each of the negative photoresist layer and the first portion of the positive photoresist layer includes a protruding portion for hindering the etching gas from etching the pattern forming layer disposed under the protruding portion, and a recessed portion thinner than the protruding portion that allows etching of the pattern forming layer disposed under the recessed portion.

6. The method according to claim 1, wherein the negative photoresist layer laminated over the first area and the first portion of the positive photoresist layer laminated over the second area have substantially the same height by removing the second portion of the positive photoresist layer exposed to the ultraviolet rays.

7. The method according to claim 1, wherein the first area and the second area are adjacent to each other on the substrate.

8. A method of forming a linear grid on a substrate, comprising:

laminating the substrate with a pattern forming layer;

laminating a negative photoresist layer over a first area of the pattern forming layer, the negative photoresist layer comprising a pre-pattern corresponding to a linear grid pattern to be formed of the pattern forming layer;

laminating a first portion of a positive photoresist layer over a second area of the pattern forming layer, and a second portion of the positive photoresist layer on at least a portion of the negative photoresist layer laminated over the first area, the first portion and the second portion of the positive photoresist layer having the pre-pattern;

covering the second area with a mask;

removing the second portion of the positive photoresist layer by exposing the second portion of the positive photoresist layer to ultraviolet radiation;

removing the mask; and forming the linear grid pattern by etching the negative photoresist layer laminated over the first area, the first portion of the positive photoresist layer laminated over the second area, and the pattern forming layer.

* * * * *